(12) United States Patent  
Marom

(10) Patent No.: US 8,963,751 B2  
(45) Date of Patent: Feb. 24, 2015

(54) SYSTEM AND METHOD FOR PHOTONICALLY ASSISTED ANALOG TO DIGITAL SIGNAL CONVERSION

(75) Inventor: Dan Mark Marom, Mevaseret Zion (IL)

(73) Assignee: Yissum Research Development Company of the Hebrew University of Jerusalem Ltd, Jerusalem (IL)

( * ) Notice: Subject to any disclaimer, the term of this patent is extended or adjusted under 35 U.S.C. 154(b) by 0 days.

(21) Appl. No.: 13/990,161

(22) PCT Filed: Nov. 29, 2011

(86) PCT No.: PCT/IL2011/050035  
§ 371 (c)(1),  
(2), (4) Date: Aug. 19, 2013

(87) PCT Pub. No.: WO2012/073243  
PCT Pub. Date: Jun. 7, 2012

(65) Prior Publication Data  
US 2013/0328706 A1      Dec. 12, 2013

Related U.S. Application Data

(60) Provisional application No. 61/417,645, filed on Nov. 29, 2010.

(51) Int. Cl.  
*H03M 1/12* (2006.01)  
*G02F 7/00* (2006.01)

(52) U.S. Cl.  
CPC ............. *H03M 1/1205* (2013.01); *G02F 7/00* (2013.01); *H03M 1/1245* (2013.01); *H03M 1/124* (2013.01)  
USPC ........................................................ 341/137

(58) Field of Classification Search  
CPC ....................................................... G02F 7/00  
USPC ........................................................ 341/137  
See application file for complete search history.

(56) References Cited

U.S. PATENT DOCUMENTS 6,043,917 A     3/2000  Sonderegger et al.  
7,868,799 B1 *  1/2011  Price et al. ................... 341/137

(Continued)

FOREIGN PATENT DOCUMENTS

EP     1698922     9/2006  
EP     1699256     9/2006

(Continued)

OTHER PUBLICATIONS

Bortnik, et al., High-speed photonically assisted analog-to-digital conversion using a continuous wave multiwavelength source and phase modulation, Optics Letters, Oct. 1, 2008, pp. 2230-2232.

(Continued)

*Primary Examiner* — Howard Williams  
(74) *Attorney, Agent, or Firm* — Browdy and Neimark, PLLC

(57) ABSTRACT

A photonically assisted analog to digital conversion (ADC) system is presented. The system comprises: an optical sampling signal generator configured and operable for generating an optical sampling signal comprising a predetermined sampling pulse sequence in the form of a time separated pulse train of spectral components dispersed in a periodic fashion, where each pulse is distinguishable by a central wavelength thereof different from its neighboring pulses. The generation of the pulse sampling sequence is achieved by combining broadband dispersion and compensation with a periodic dispersion compensator having a free spectral range smaller than the broad bandwidth of the ultrashort pulse. The second innovative element is the introduction of coherent detection with oversampling of the interference terms of the phase modulated pulse sampling sequence and a reference pulse. The over-sampling provides additional measurements of the beat term and by way of error minimization a more reliable phase estimation is provided, translated into a more accurate conversion to digital representation. The system further comprises an electro-optical modulator for interacting an input electric analog signal and an optical sampling signal and generating a modulated optical signal indicative of said input signal; and a detection system configured and operable for receiving said modulated optical signal and generating an output digital signal corresponding to said input electric analog signal.

36 Claims, 15 Drawing Sheets

(56) References Cited

U.S. PATENT DOCUMENTS

| | | | |
|---|---|---|---|
| 8,334,797 B1* | 12/2012 | Ng et al. | 341/137 |
| 2001/0021059 A1 | 9/2001 | Yariv | |
| 2002/0176151 A1 | 11/2002 | Moon et al. | |
| 2002/0196520 A1 | 12/2002 | Marom et al. | |
| 2005/0169324 A1 | 8/2005 | Ilday et al. | |
| 2005/0226635 A1 | 10/2005 | Ionov et al. | |
| 2007/0081761 A1 | 4/2007 | Doerr et al. | |
| 2011/0234435 A1* | 9/2011 | Woodward et al. | 341/137 |

FOREIGN PATENT DOCUMENTS

| | | |
|---|---|---|
| WO | 9926363 | 5/1999 |
| WO | 0241073 | 5/2002 |
| WO | 2007041706 | 4/2007 |

OTHER PUBLICATIONS

Doerr, et al, Monolithic InP Multi-Wavelength Coherent Receiver, OFC 2010 Post-Deadline Paper PDPB1, pp. 1-3.

Doerr, et al., Monolithic Silicon Coherent Receiver, OFC 2009 Post-Deadline Paper PDPB2, pp. 1-3.

El-Chammas, et al., A 12-GS/s 81-mW 5-bit Time-Interleaved Flash ADC with Background Timing Skew Calibration, 2010 Symposium on VLSI Circuits/Technical Digest of Technical Papers, pp. 157-158.

Fontaine, et al., Real-time full-field arbitrary optical waveform measurement, Nature Photonics, Apr. 2010, pp. 248-254, vol. 4.

Frenkel, et al., Compensation of Dispersion in Optical Fibers for the 1.3-1.6 urn Region with a Grating and Telescope, IEEE Journal of Quantum Electronics, Sep. 1989, pp. 1981-1984, vol. 25, No. 9.

Frumker, et al., Femtosecond pulse shaping using a two-dimensional liquid-crystal spatial light modulator, Optics Letters, Jun. 1, 2007, pp. 1384-1386, vol. 32, No. 11.

Greshishchev, et al., A 40GS/s 6b ADC in 65nm CMOS, IEEE International Solid-State Circuits Conference, 2010, pp. 390-392, session 21.

Gupta, Distortion Cancellation in Time-Stretch Analog-to-Digital Converter, Journal of Lightwave Technology, Dec. 2007, pp. 3716-3721, vol. 25, No. 12.

Han, et al., Photonic Time-Stretched Analog-to-Digital Converter: Fundamental Concepts and Practical Considerations, Journal of Lightwave Technology, Dec. 2003, pp. 3085-3103, vol. 21, No. 12.

Han, et al., Ultrawide-Band Photonic Time-Stretch A/D Converter Employing Phase Diversity, IEEE Transactions on Microwave Theory and Techniques, Apr. 2005, pp. 1404-1408, vol. 53, No. 4.

International Search Report from PCT/IL2011/050035, mail date Oct. 5, 2012.

Juodawlkis, et al., Optically Sampled Analog-to-Digital Converters, IEEE Transactions on Microwave Theory and Techniques, Oct. 2001, pp. 1840-1853, vol. 49, No. 10.

Marom, et al., Compact Spectral Pulse Shaping using Hybrid Planar Lightwave Circuit and Free-Space Optics with MEMS piston micromirrors and Spectrogram Feedback Control, IEEE, Jan. 1, 2004, pp. 585-586.

Marom, et al., Wavelength-Selective 1×K Switches Using Free-Space Optics and MEMS Micromirrors: Theory, Design, and Implementation, Journal of Lightwave Technology, Apr. 2005, pp. 1620-1630, vol. 23, No. 4.

Moss, et al., Multichannel tunable dispersion compensation using all-pass multicavity etalons, Optical Fiber Communication Conference and Exhibit—OFC, 2002, pp. 132-133.

Motafakker-Fard, et al., Dynamic Range Improvement in Photonic Time-Stretch Analog-to-Digital Converter, OFC'09, 2009, paper OMI2, pp. 1-3.

Sinefeld, et al., A photonic spectral processor employing two-dimensional WDM channel separation and a phase LCoS modulator, Optics Express, 2011, pp. 14532-14541, vol. 19, No. 15.

Sinefeld, et al., All-channel tunable optical dispersion compensator based on linear translation of a waveguide grating router, Optics Letters, Apr. 15, 2011, pp. 1410-1412, vol. 36, No. 8.

Sinefeld, et al., Hybrid Guided-Wave/Free-Space Optics Photonic Spectral Processor Based on LCoS Phase Only Modulator, IEE Photonics Technology Letters, Apr. 1, 2010, pp. 510-512, vol. 22, No. 7.

Sinefeld, et al., Spectral Processor Implemented with Hybrid Free-Space and Guided-Wave Optics and Active LCOS Modulator, IEEE, 2008, pp. 380-383.

Valley, Photonic analog-to-digital converters, Optics Express, Mar. 5, 2007, pp. 1955-1982, vol. 15, No. 5.

Weiner, Femtosecond pulse shaping using spatial light modulators, Rev. Sci. Instrum., 2000, pp. 1929-1960, vol. 71.

Williamson, et al., Effects of Crosstalk in Demultiplexers for Photonic Analog-to-Digital Converters, Journal of Lightwave Technology, Feb. 2001, pp. 230-236, vol. 19, No. 2.

Wu, et al., Optical MEMS for Lightwave Communication, Journal of Lightwave Technology, Dec. 2006, pp. 4433-4454, vol. 24, No. 12.

Yariv, et al., Time interleaved optical sampling for ultra-high speed A/D conversion, Electronics Letters, Oct. 15, 1998, pp. 2012-2013, vol. 34, No. 21.

* cited by examiner

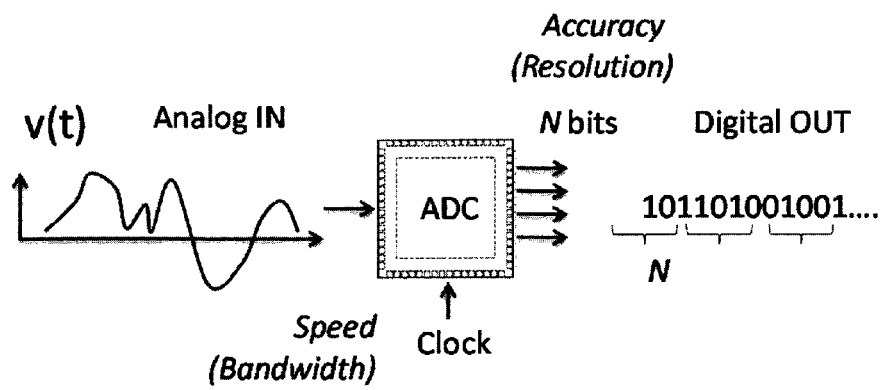
FIG. 1A (GENERAL ART)
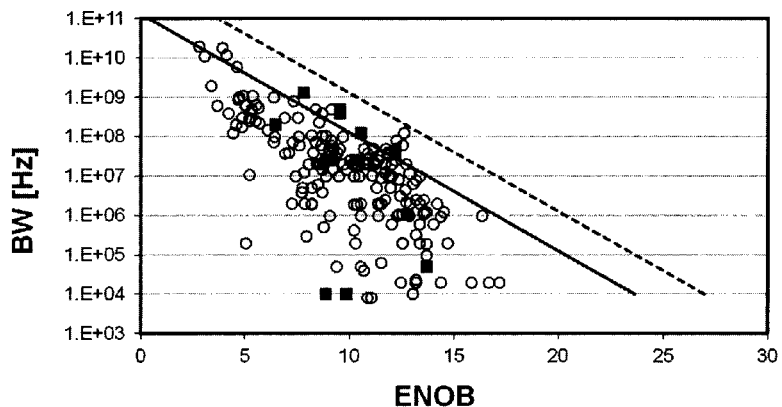
FIG. 1B (GENERAL ART)
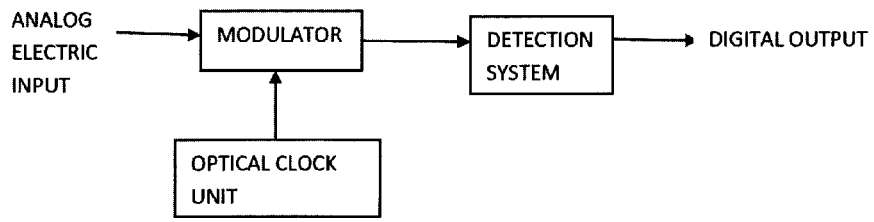
FIG. 2 (GENERAL ART)

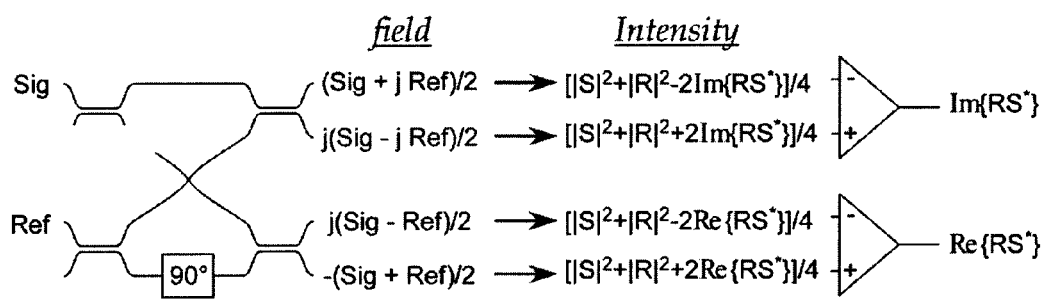
FIG. 4A (GENERAL ART)

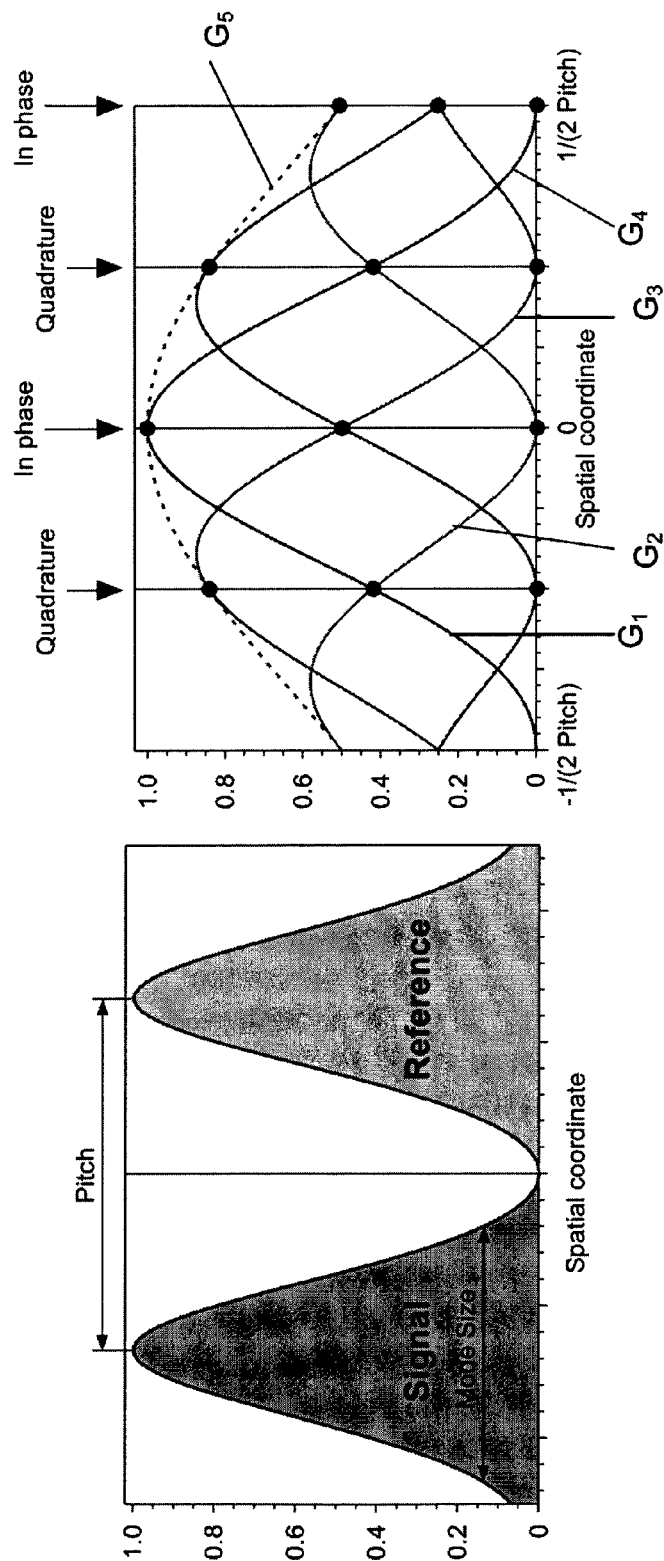
FIG. 4C (GENERAL ART)
FIG. 4B (GENERAL ART)

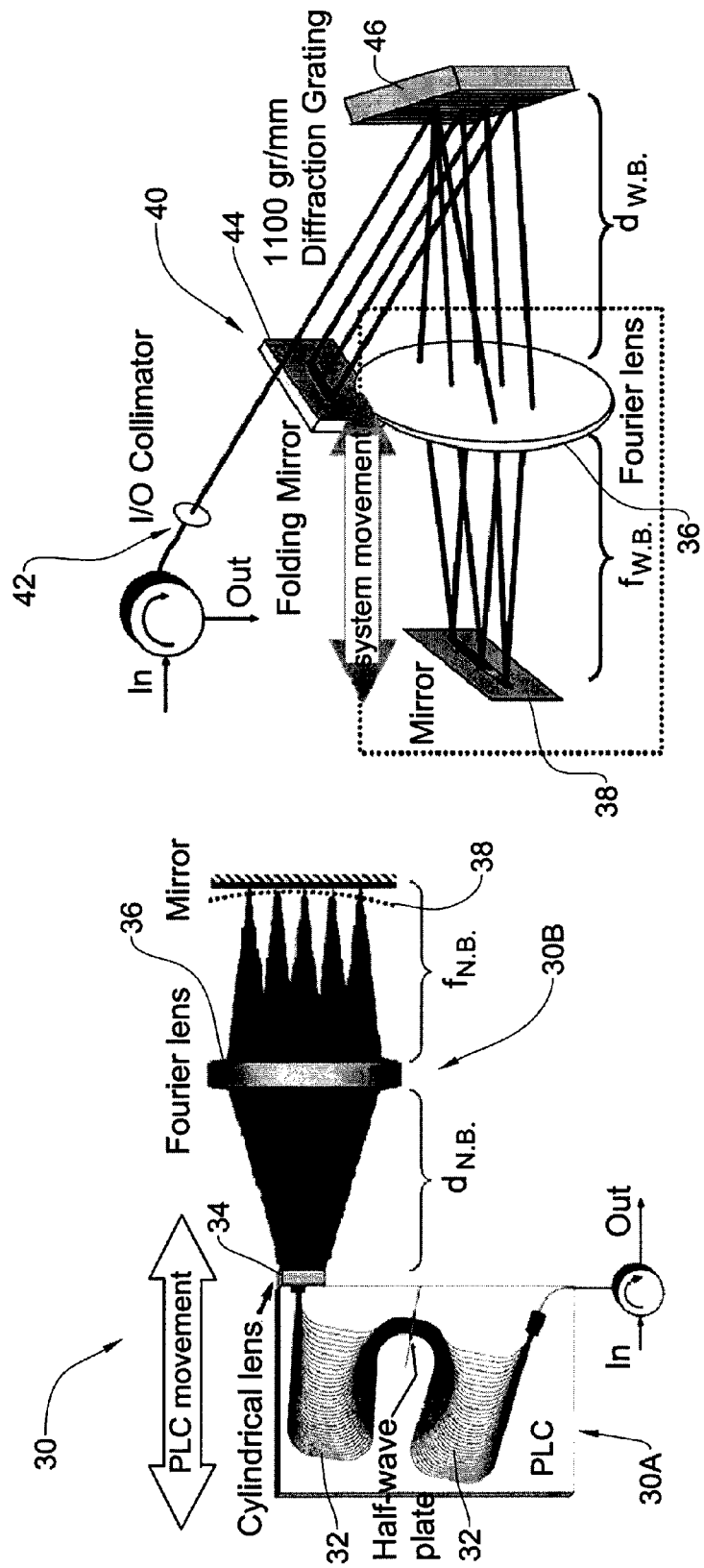

SYSTEM AND METHOD FOR PHOTONICALLY ASSISTED ANALOG TO DIGITAL SIGNAL CONVERSION

FIELD OF THE INVENTION

This invention is generally in the field of analog to digital signal conversion, and relates to a system and method for photonically assisted analog to digital signal conversion.

REFERENCES

The following references are considered to be pertinent for the purpose of understanding the background of the present invention:

1. Y. M. Greshishchev et al., "A 40 GS/s 6b ADC in 65 nm CMOS," Solid-State Circuits Conference Digest of Technical Papers (ISSCC), 2010 IEEE International, 390-391, 7-11 Feb. 2010
2. M. El-Chammas and B. Murmann, "A 12-GS/s 81-mW 5-bit Time-Interleaved Flash ADC with Background Timing Skew Calibration," 2010 IEEE Symposium on VLSI Circuits, Honolulu, Hi., June 2010.
3. G. C. Valley, Photonic analog-to-digital converters, Opt. Express, 15, 1955-1982 (2007).
4. R. C. Williamson, P. W. Juodawlkis, J. L. Wasserman, G. E. Betts, and J. C. Twichell, "Effects of crosstalk in demultiplexers for photonic analog-to-digital converters," J. Lightwave Technol. 19, 230 (2001).
5. P. Juodawlkis et al, "Optically sampled analog-to-digital converters," IEEE Trans. Microwave Theory Tech. 49, 1840, (2001).
6. N. K. Fontaine et al, "Real-time full-field arbitrary optical waveform measurement," Nature Photonics, Vol. 4, 248-254 (2010).
7. A. M. Fard, S. Gupta, B. Jalali, "Dynamic range improvement in time-stretch analog-to-digital converter," OFC'09, paper OMI2 (2009).
8. C. R. Doerr, P. J. Winzer, S. Chandrasekhar, M. Rasras, M. Earnshaw, J. Weiner, D. M. Gill, and Y. K. Chen, "Monolithic Silicon Coherent Receiver," OFC 2009 Post-Deadline Paper PDPB2.
9. C. R. Doerr, L. Zhang, and P. J. Winzer, "Monolithic InP Multi-Wavelength Coherent Receiver," OFC 2010 Post-Deadline Paper PDPB1.
10. Y. Han and B. Jalali, "Photonic Time-Stretched Analog-to-Digital Converter: Fundamental Concepts and Practical Considerations," J. Lightwave Technol. 21, pp. 3085-3103, 2003.
11. Y. Han, O. Boyraz, and B. Jalali, "Ultrawide-band photonic time-stretch A/D converter employing phase diversity," IEEE Trans. Microwave Theory and Techniques 53, pp. 1404-1408, 2005.
12. S. Gupta, G. C. Valley, and B. Jalali, "Distortion Cancellation in Time-Stretch Analog-to-Digital Converter," J. Lightwave Technol. 25, pp. 3716-3721, 2007.
13. D. Sinefeld and D. M. Marom, "Hybrid Guided-Wave/Free-Space Optics Photonic Spectral Processor Based on LCoS Phase Only Modulator," Photon. Technol. Lett. 22, pp. 510-512, 2010.
14. D. Sinefeld and D. M. Marom, "Photonic Spectral Processor Employing Two-Dimensional WDM Channel Separation and a Phase LCoS Modulator," Optical Fiber Communication (OFC) Conference, San Diego 2010.
15. Bartosz J. Bortnik and Harold R. Fetterman, "High-speed photonically assisted analog-to-digital conversion using a continuous wave multiwavelength source and phase modulation", Optics Letters, Vol. 33, Issue 19, pp. 2230-2232 (2008).
16. D. I. Moss, S. McLaughlin, G. Randall, M. Lamont, M. Ardekani, P. Colbaurne, "Multichannel tunable dispersion compensation using all-pass multicavity etalons," Optical Fiber Communication Conference and Exhibit—OFC, 132-133 (2002).
17. E. Frumker and Y. Silberberg, "Femtosecond pulse shaping using a two-dimensional liquid-crystal spatial light modulator," Opt. Lett. 32, 1384-1386 (2007).
18. A. M. Weiner, "Femtosecond pulse shaping using spatial light modulators," Rev. Sci. Instrum. 71, 1929-1960 (2000).
19. A. Frenkel, J. P. Heritage, and M. Stern, "Compensation of Dispersion in Optical Fibers for the 1.3-1.6 µm Region with a Grating and Telescope," IEEE J. Quant. Electron. 25, 1981-84 (1989).
20. A. Yariv and R. G. M. P. Koumans, "Time interleaved optical sampling for ultra high speed A/D conversion" Electron. Lett. 34, 2012-13, 1998.

BACKGROUND OF THE INVENTION

Most of signal processing techniques, as well signal transmission, collection and storage techniques, utilize digital representation of the measured/received analog signals. Accordingly, the analog signals appearing in nature should first undergo analog to digital conversion (ADC). Today's information society owes much of its success to ADC technology. While electronic ADC technology has vastly been improving, progress eventually slowed down. In the last years, ADC speeds merely doubled, falling short of Moore's law. Electronic ADC technology is the bottleneck today between high-speed analog signal acquisition and the accompanying digital signal processing.

The configuration of the state-of-the-art electronic ADC system is schematically illustrated in FIG. 1A. As shown, an input analog electrical signal is received by an ADC unit, which is operated by a clock with a certain sampling speed (corresponding to at least twice the electrical bandwidth, according to Nyquist sampling criterion) and produces an output digital signal being a quantized digital representation of the sampled values with certain accuracy (resolution) defined by effective number of bits (ENOB). FIG. 1B shows a survey of state-of-the-art electronic ADC performance, where x-axis corresponds to the ENOB and y-axis corresponds to the analog bandwidth. Advance along either of these axes is extremely challenging and is mainly limited by the timing jitter of the electrical sampling circuitry.

With today's state of the art for fast sampling, ENOB of 4.5 bits at 10 GHz and 3.9 bits at 18 GHz [1] or 5-bit (~4 ENOB) at 12 GS/sec [2] can be obtained. Higher resolution conversion occurs at much slower conversion rates. A recent commercial National Semiconductor product (ADC12D1800) provides sampling rates of 3.6 GS/s, achieved by interleaving a pair of ADCs, each operating at 1.8 GS/s at 9.2 ENOB.

It should be noted that the difficulty of attaining high vertical resolution grows extremely rapidly with frequency. Adding ENOBs is an exponentially difficult task, as each extra ENOB means quadrupling the overall SNR from all noise sources.

In an effort to achieve higher-performance ADCs, there have been numerous applications of photonic technologies to the task of A/D conversion, motivated by the slow improvement trend in bandwidth-resolution performance of electronic ADC, and spurred by the unique advantages of photonics. Various photonic approaches are described in the literature [3] aimed at addressing the limitations of electronic ADC in the sampling and/or quantization techniques (which are the two successive stages of generic ADC operation). Photonic ADC systems have been developed capable of performing sampling, quantization, both sampling and quantization procedures, parallelism gain, etc. Many of such examples of photonic analog-to-digital converter are described for example in Reference 3.

As exemplified in FIG. 2, one typical photonic ADC system includes an optical source producing an optical clock signal in the form of pulses at high repetition rate, a modulator, and an optical detection system including a photodiode. In some cases the optical source is directly modulated by the RF signal, but in most cases a mode-locked laser (either solid state, fiber or semiconductor based) is used for the optical source; and an external modulator, usually a Mach-Zehnder interferometer fabricated from $LiNbO_3$, impresses the RF signal on the optical intensity. In a more general RF photonic link, there is a long fiber or an optical processing stage between the electro-optic modulator and the photodiode. The photocurrent generated at the detection of each of the optical sampling pulses with low timing jitter is then quantized by electrical ADC, deriving the digital signal representation of the RF signal.

In the above example, the photodiode must operate as quickly as the sampling pulses incident on it. Likewise, the ADC must perform its conversion operation at the sampling pulse rate. This limitation can be alleviated by distinguishing between sampling pulses, by wavelength as suggested in Ref. [20]. Here N synchronized optical sampling pulse sources are combined in a manner that forms N equidistant pulses in a frame, which then repeats itself. Since the modulator operation is wavelength independent, the sampling pulses carry the information provided by the electrical RF signal driving the modulator, as in the previous case. However, an optical demultiplexer with a single input port and N output ports accepts the sampling pulse sequence and separates these pulses according to wavelength, such that each pulse in the frame emerges in its own output port. A photodiode disposed at each demultiplexer output port (i.e., N photodiodes in total) converts the incident optical pulse to a photocurrent to be subsequently quantized by an electrical ADC (or plurality of N ADCs, each associated with a photodiode). This photonically-assisted configuration advantageously provides for reduced electrical rate detection and quantization by factor N.

Another example of a photonically-assisted ADC system is described in reference [15], which utilizes N continuous wave (CW) laser sources, each with a unique wavelength, and phase modulation. The output of the superimposed CW multi-wavelength sources is phase modulated by the common phase modulator being driven by a sinusoidal electrical signal and then launched into a dispersive device (such as a single-mode fiber). This fiber creates a pulse train by way of phase modulation being converted to amplitude modulation in the dispersive device for each wavelength component, and the pulses walk off due to the dispersion and form a sequence of N optical pulses each with a different central wavelength, as in the previous example. The optical pulses then go to a second modulator, as an intensity modulator for sampling the RF signal, to be followed by detection schemes using a demultiplexer and N photodiodes and ADC.

Most progress occurred in the field of photonic sampling [4-6], capitalizing on the availability of mode-locked-lasers (MLL) with very low jitter (~fsec) and fast electro-optic modulators that when combined impart the voltage-under-test (VUT) $v_{UT}(t)$ onto the amplitude of each optical sampling pulse $v_{UT}(kT)$, to be further quantized after detection by means of a conventional electronic ADC (the time jitter of electronic ADCs is in the range of 0.1-0.5 psec). An alternative time-stretch architecture provides spectacular performance in the TeraHz range (e.g. [7]), yet only usable for short intervals that need to be carved out from a continuous signal-stream.

GENERAL DESCRIPTION

The present invention provides a novel photonically-assisted ADC technique, which is capable of improving either one or both of the main factors characterizing the ADC process, namely the sampling rate and the detection resolution. The ADC of the present invention can scale to operate at many sampling rates, for example 100 GS/s or faster, with improved quantization accuracy over the employed electrical ADC by way of signal processing applied to multiple samples of the same signal.

The ADC of the present invention is configured as internally-photonic structure but with electronic input/output interfaces. The role of photonics in the photonically-assisted ADC of the present invention is to first bridge the gap between electronic ADC abilities and sampling rate requirements, i.e. photonics is used as a serial to parallel converter of information by wavelength, and second to increase the accuracy of the conversion beyond the electrical ADC capabilities, i.e. photonics is used to oversample the information and reduce the error contributions by digital signal processing (DSP). The photonically-assisted ADC architecture of the present invention is based on converting the voltage-under-test (VUT) to phase modulation applied to an optical sampling pulse source or preferentially to a frame of sampling pulse distinguished by wavelength created by the technique of the invention or other known techniques. Operating under phase modulation provides greater linearity in the modulation response, and the present invention utilizes coherent detection concepts applied across multiple bases for quantizing the sampled information in shot-noise limited performance.

Generally, the ADC scheme of the invention in its one aspect, includes such stages generating an optical clock signal in the form of a predetermined sampling pulse sequence, interacting this sampling pulse sequence with the use of a modulator driven by an input analog electrical signal thereby producing a modulated optical signal (preferably phase modulated). Then, the (phase) modulation is detected (e.g. coherent detection), and the photocurrent generated by the optical data indicative thereof is converted to output digital representation of the input electrical signal.

According to the invention, the predetermined sampling pulse sequence is in the form of a time separated pulse train of spectral components dispersed in a periodic fashion, where each pulse is characterized by a central wavelength different from its neighboring pulses. This is achieved by applying a periodic dispersion to a chirped pulse optical signal. As for the chirped pulse, it can be provided either by using a similariton pulse or laser, or by applying a continuous dispersion to a wideband laser pulse (e.g. mode locked laser pulse), e.g. using an appropriate dispersive element/unit such as a dispersive optical fiber. It should be understood that the wideband optical pulse is preferably a short pulse to provide desirably fast sampling. The processing gain of introducing sampling pulses of different central wavelengths is achieved in the parallel detection step performed after separating the pulses with a demultiplexer.

The periodic dispersion of a chirped pulse is typically achieved by applying a periodically reversed dispersion relative to the chirped pulse. This procedure consists of grouping frequency components of the chirped pulse and applying the dispersion compensation to each group separately to thereby reverse the chirp profile within each group. This results in a sequence of sub-pulses, each characterized by its central wavelength and a temporal delay according to that of the respective group. This method of producing the pulse train having different central wavelengths from a single chirped pulse is used for creating a corresponding clock signal enabling faster sampling of the analog input signal, each pulse is transform limited and inversely proportional to the bandwidth granularity of the periodic dispersion compensation, and the time separation is determined by the product of the chirp rate and periodic bandwidth.

According to another aspect, the invention provides for high resolution conversion to digital procedure. The invention utilizes phase modulation of a clock signal (preferably a clock signal having the above described profile of ideal sampling pulse sequence) resulting from interaction of the clock signal with the input analog signal, followed by oversampling technique. The latter consists of interfering the modulated clock signal with a reference clock signal in a manner producing multiple interference samples. Collecting multiple samples of the interference pattern provides an increase in the measurements and by statistical error reduction means enables increased conversion resolution after processing all the samples jointly. Thus, the higher the number of interference samples, the higher is the sampling accuracy (resolution).

Thus, according to one broad aspect of the invention, there is provided a photonically assisted analog to digital conversion (ADC) system, which comprises: an optical sampling signal generator configured and operable for generating an optical sampling signal comprising a predetermined sampling pulse sequence in the form of a time separated pulse train of spectral components dispersed in a periodic fashion, where each pulse is distinguishable by a central wavelength thereof different from its neighboring pulses; an electro-optical modulator for interacting an input electric analog signal and an optical sampling signal and generating a modulated optical signal indicative of said input signal; and a detection system configured and operable for receiving said modulated optical signal and generating an output digital signal corresponding to said input electric analog signal.

The optical sampling signal generator comprises a chirped pulse generator; and a periodic dispersion unit in an optical path of a chirped pulse. The chirped pulse generator may include one of the following: (i) a similariton pulse amplifier or a similariton laser; and (ii) a wideband pulsed laser, and a continuous dispersive media for passing a wideband pulse therethrough. The continuous dispersive media may comprise a dispersive optical fiber. The wideband pulsed laser may include a mode locked laser.

In some embodiments, the periodic dispersion unit is configured and operable for applying to the chirped pulse a periodically reversed dispersion relative to a wavelength profile of the chirped pulse, thereby grouping frequency components of the chirped pulse and applying dispersion compensation to each group separately to reverse the wavelength profile within each group, and producing a sequence of sub-pulses, each characterized by its central wavelength and a temporal delay according to that of the respective group.

In some embodiments, the periodic dispersion unit is configured and operable for generating a transfer function comprising a tunable staircase group delay, and increasing time delays across contiguous spectral bandwidths, the staircase group delay breaking an incident ultrashort pulse into a burst of output pulses, each pulse being transform-limited by a stair bandwidth and offset from its neighboring pulses in time by a staircase step height. The optical sampling signal generator may comprise a cascade arrangement of a continuous chromatic dispersive element and a wavelength division multiplex (WDM) dispersion compensator having a free spectral range (FSR) equal to a channel separation, thereby producing said staircase group delay transfer function.

In some embodiments, the optical sampling signal generator comprises an optical dispersion compensator (TODC) having a spectral band narrower than that of a broadband short pulse spectrum, and a relatively wideband chromatic dispersive unit, to thereby provide spectrally and temporarily separate pulse train presenting a combined staircase group delay. The TODC may comprise one or more tunable chromatic dispersive elements, thereby being tunable in step height, the optical sampling signal generator thereby providing a tunable sampling frequency.

The periodic dispersion unit may comprise the TODC unit configured and operable for performing high resolution dispersion from an arrayed waveguide grating. The TODC may comprises two parts displaceable one with respect to the other, which comprise, respectively, a planar lightwave circuit (PLC), and a far-field spectral disperser. The PLC may include an arrayed waveguide grating, and the far-field spectral disperser may include a Fourier lens and a mirror, a change in a distance between the PLC and the Fourier lens imparting a quadratic phase across a Fourier plane resulting in a group dispersion slope along a spectrum.

In some embodiments, the chirped pulse generator comprises a continuous dispersive media for passing a wideband pulse therethrough, where the continuous dispersive media comprises a wideband chromatic dispersive unit based on dispersion from a bulk diffraction grating. The wideband chromatic dispersive unit may comprise two parts displaceable with respect to each other, one part including a collimator, a folding mirror, and a diffraction grating, and the other part including a Fourier lens and a mirror.

In some embodiments, the periodic dispersion unit comprises a dispersive assembly comprising an arrayed waveguide grating configured to form a phase array source, a spatial Fourier transformer, and a reflection-mode spatial light modulator, thereby enabling recombining of reflected and dispersed signals by back propagation through the same dispersive assembly, and being separated to an output fiber via a circulator. The periodic dispersion unit may further comprise a crossed diffraction grating dispersing light in a direction substantially perpendicular to a dispersion direction of the arrayed waveguide grating. Optionally, a half-wave plate may be further used to make the arrayed waveguide grating polarization-independent.

Preferably, the electro-optical modulator is configured and operable as a phase modulator; and the detection system comprises an interferometer unit for interfering the modulated signal with a reference signal corresponding to the optical sampling signal.

The interferometer unit may comprise a waveguide device configured and operable to provide waveguide-based interference. In some other embodiments, the interferometer unit is configured for free space interference. Preferably, the interferometer unit comprises two inputs for respectively the modulated signal and the reference signal, and at least 6 outputs corresponding to 6 samples of the modulated signal.

The ADC system (its detection system) preferably further includes a wavelength demultiplexer for spatially separating wavelength components of a signal corresponding to the modulated signal. Considering the interferometer based detection system, the wavelength demultiplexer provides for spatially separating wavelength components in an interference pattern resulting from the interference between the modulated and reference signals.

According to another broad aspect of the invention, there is provided a system comprising: an optical sampling signal generator for generating an optical sampling signal; an electro-optical modulator configured and operable as a phase modulator for interacting an input electric analog signal and an optical sampling signal and generating a phase-modulated optical signal indicative of said input signal; and a detection system configured and operable for receiving said modulated optical signal and generating an output signal corresponding to said input electric signal, wherein the detection system comprises an interferometer unit for interfering the modulated signal with a reference signal corresponding to the optical sampling signal, the interferometer unit comprising two inputs for respectively the modulated signal and the reference signal, and at least 6 outputs corresponding to at least 6 samples respectively of the modulated signal.

According to yet another broad aspect of the invention, there is provided an optical sampling signal generator for use in an analog to digital conversion (ADC) system, the optical sampling signal generator being configured and operable for generating an optical sampling signal comprising a predetermined sampling pulse sequence in the form of a time separated pulse train of spectral components dispersed in a periodic fashion, where each pulse is characterized by a central wavelength different from its neighboring pulses.

BRIEF DESCRIPTION OF THE DRAWINGS

In order to understand the invention and to see how it may be carried out in practice, embodiments will now be described, by way of non-limiting example only, with reference to the accompanying drawings, in which:

FIGS. 1A and 1B schematically illustrate the principles of the of electronic ADC technology and its current state of the art configuration;

FIG. 2 shows a typical photonic ADC system;

FIGS. 3A and 3B show two examples of the ADC system configured for increasing the sampling rate, FIGS. 3C and 3D show two examples of the ADC system configured for improving the system resolution;

FIG. 4A illustrates the detection technique corresponding to conventional coherent detection of a signal with a local reference by way of interference in a 90° optical hybrid;

FIGS. 4B and 4C show the general principles of coherent detection in free space interference, where FIG. 4B shows spatial profiles of the input signal and reference beams, and FIG. 4C illustrates various intensity interference patterns;

FIG. 6A shows noisy measurements of projection values, and shows the best fit estimate for the unknown phase; and FIG. 6B shows simulation results of the phase estimation error terms as a function of number of balanced photodetectors for ADCs configurations with different ENOB;

FIGS. 8D to 8G show some examples of the configurations of the PSP unit suitable to be used in the ADC system of the invention.

DETAILED DESCRIPTION OF EMBODIMENTS

FIG. 1A schematically illustrates the principles of electronic ADC technology, and FIG. 1B illustrates the state of the art ADC technology at the time of submission. FIG. 2 shows a typical photonic ADC system.

Reference is made to FIGS. 3A to 3D showing four examples, respectively, of a photonically-assisted ADC system of the present invention. To facilitate understanding, the same reference numbers are used for identifying those components which are common in all the examples of the invention.

A system of the present invention, generally designated 10, is configured as internally-photonic structure but with electronic input/output interfaces, and includes the following main functional components: input and output ports 12A and 12B for inputting analog electric input $S_{in}$ and outputting digital electric output $S_{out}$; an optical sampling signal generator (optical clock unit) 14, modulator 16 and detection system 18. Optical clock unit 14 is configured for producing a sampling signal $S_{samp}$. The sampling signal $S_{samp}$ interacts with input analog electric input $S_{in}$ at the modulator 16, and a resulted modulated optical signal $S_{mod}$ propagates to detection system 18, which generates $S_{det}$.

Figure 3A:
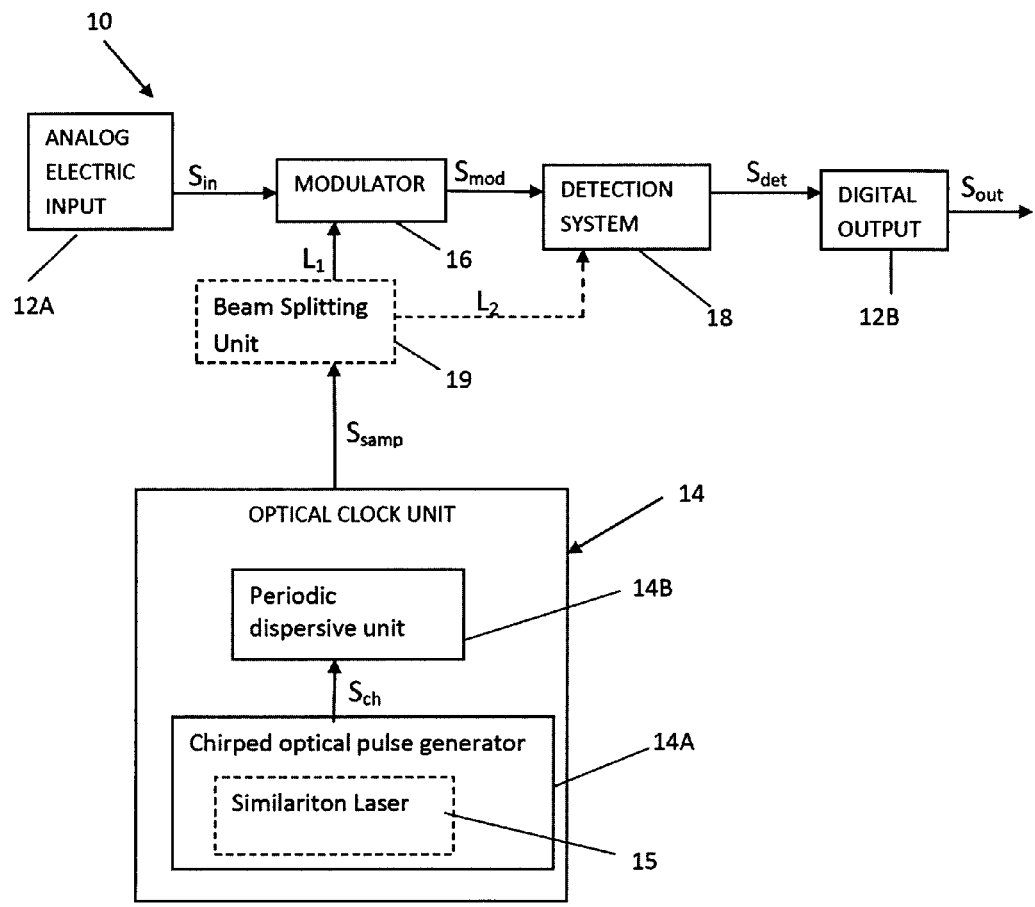
FIGS. 3A to 3D exemplify the configurations of a photonically-assisted ADC system of the invention, where
Figure 3B:
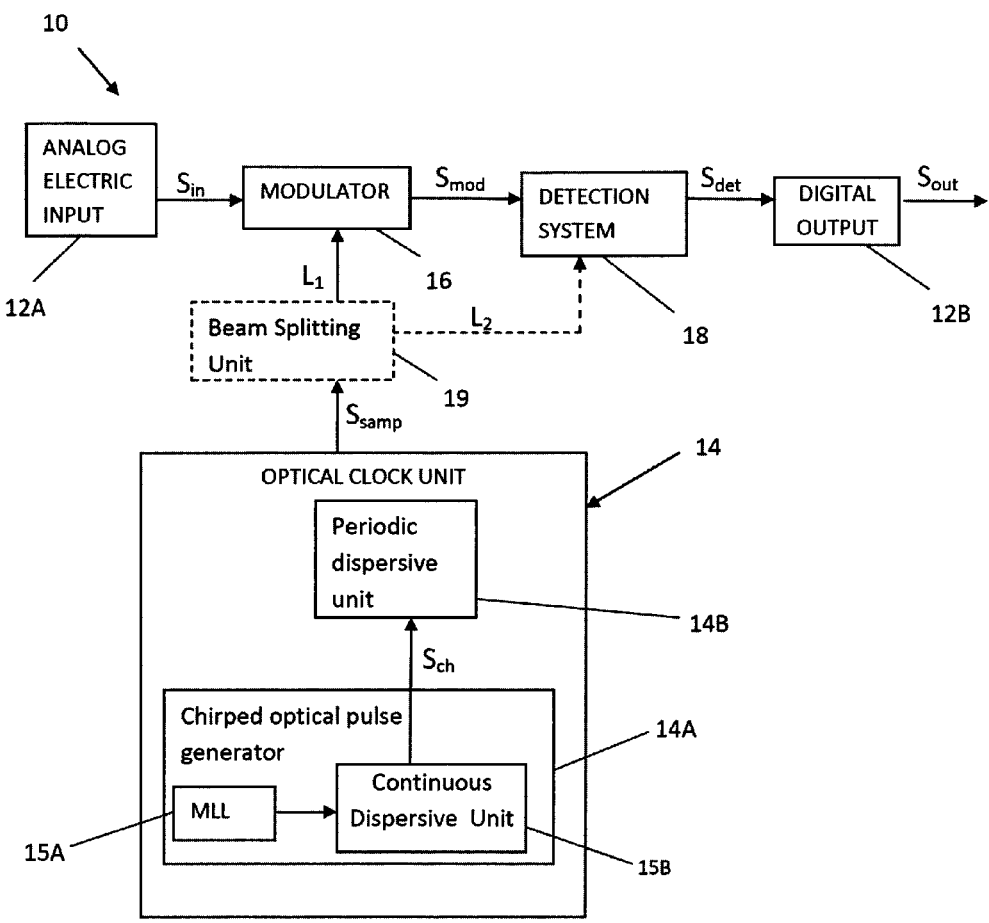

In the examples of FIGS. 3A and 3B, system 10 is configured according to some aspects of the invention providing for increasing the sampling rate. To this end, the system utilizes optical clock unit 14 configured and operable according to the invention to produce a predetermined sampling pulse sequence in the form of a time separated pulse train of spectral components dispersed in a periodic fashion, where each pulse is characterized by a central wavelength different from its neighboring pulses. The clock unit 14 includes an optical pulse generator 14A configured for generating a chirped pulse signal $S_{ch}$, and a dispersive unit 14B configured for applying periodic dispersion to the chirped pulse signal $S_{ch}$, resulting in the predetermined sampling pulse sequence $S_{samp}$.

As shown in the example of FIG. 3A, optical pulse generator 14A may include a similariton pulse or laser 15 that generates similariton pulses. These pulses have chirped waveforms of parabolic profile that are self-similar, i.e. they remain parabolic as their power increases. Alternatively, as exemplified in FIG. 3B, optical pulse generator 14A includes a mode-locked laser (MLL) source 15A emitting wideband transform limited pulses, and an appropriate dispersive unit 15B that applies continuous dispersion to the pulse thereby stretching in time the transform limited pulses. This may be achieved using fiber optics, e.g. single mode fiber that disperses the pulse.

In both of these examples, the pulse formed by optical pulse generator 14A is chirped, meaning that the center carrier frequency changes (ideally) linearly in time. The chirped pulses then pass through unit 14B where the chirped waveform undergoes periodic dispersion.

Generally, periodic dispersive unit 14B is configured according to the invention as a so-called Photonic Spectral Processor (PSP) operable to apply to a chirped pulse a frequency-periodic reversed dispersion relative to the wavelength profile of the chirped pulse. The frequency periodicity is termed free spectral range (FSR). According to a specific but not limiting examples, PSP 14B may operate for grouping frequency components of the chirped pulse and applying the dispersion compensation to each FSR group jointly, to thereby reverse the chirp profile within each group. The result of the PSP of the present invention applied to a chirped pulse is generation of a wavelength-swept sampling pulse sequence, namely a sequence of sub-pulses, where each sub-pulse is characterized by its central wavelength and a temporal delay according to that of the respective group. Thus, the PSP converts the chirped waveform into a sequence of transform limited pulses, where the center carrier of each pulse is varied. This is the ideal form of a sampling pulse sequence, which is required to mimic a sequence of delta functions for sampling a discrete value in time and not be distorted by temporal variations of the electrical signal.

The PSP 14 applies a chirp cancelation spectral phase modulation across bands of the pulse's bandwidth, compressing the band's components to a locally transform limited pulse (the sub-pulses' duration is the inverse of the FSR). The PSP 14 is a high-resolution processor capable of imparting any spectral amplitude and phase onto the signal, realized in a hybrid guided-wave/free-space arrangement. The use of such periodic dispersive unit 14 is advantageous over the time stretching of ultrashort laser pulses, in that it provides a continuous pulse stream of transform limited, low jitter pulses (possibly of equal amplitude), distinguishable by center wavelength. This facilitates further conversion of the information carried on each pulse. Some examples of the configuration and operation of the PSP 14 of the present invention will be described below with reference to FIGS. 8A-8G.

Thus, the sampling pulse sequence $S_{sam}$ produced by the above described optical clock unit 14 is directed to modulator 16 where it interacts with the input analog electric signal, and modulated optical signal $S_{mod}$ propagates to detection system 18. The modulator 16 and detection system 18 may have any known suitable configurations so as to convert each sub-pulse (characterized by wavelength and time features) into a corresponding electric signal (voltage).

Generally, the detection system may utilize intensity detectors. More specifically, in this configuration, photonic signals are converted to photocurrents and subsequently quantized in the electrical domain by an ADC processor. The ADC processor outputs a digital representation of the photocurrent, faithful to accuracy of a number of bits termed effective number of bits (ENOB).

Preferably, modulator 16 is a phase modulator, and detection system 18 utilizes an interferometric scheme which consists of interfering the modulated signal $S_{mod}$ with a reference clock signal, as shown in FIGS. 3A and 3B in dashed lines. In these specific but not limiting examples, a beam splitting unit 19 is used in an optical path of sampling pulse sequence $S_{sam}$ produced by clock unit 14 and propagating to modulator 16, which splits the sampling signal $S_{sam}$ into two light portions $L_1$ and $L_2$, allowing propagation of light portion $L_1$ to modulator 16 and directing light portion $L_2$ to detection system 18 to thereby enable interference between light portion $L_2$ (constituting reference clock signal) with modulated signal $S_{mod}$.

The ADC scheme of the present invention utilizes a serial to parallel conversion of information by wavelength. To this end, the detection system utilizes a wavelength selective detection (e.g. using a matching wavelength demultiplexer), thus detecting each wavelength component separately. This provides a slower ADC process to convert the information carried on each pulse, and increases the effective sampling by the parallelism factor. Indeed, the use of separate detection of each wavelength components from N such components $\lambda_1, \ldots, \lambda_N$, yields the rate improvement factor of N.

Figure 3C:
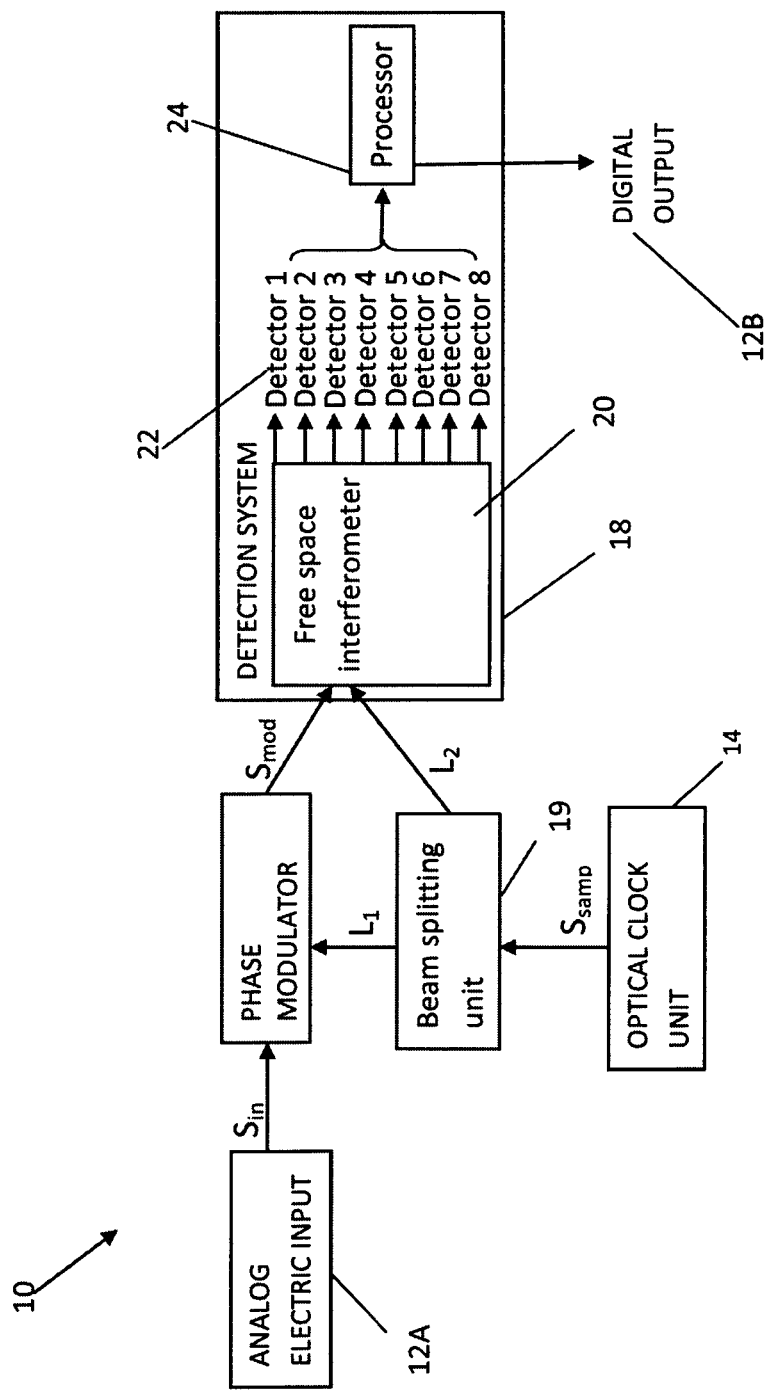

Turning now to FIG. 3C, system 10 is configured according to some other aspects of the invention, which may or may not be combined with that of FIGS. 3A-3B. According to the example in FIG. 3C, ADC system 10 includes electric input and output ports 12A and 12B, electro-optical modulator 16, optical clock unit 14 and detection system 18.

The optical clock unit 14 is configured to generate an optical pulse sequence, and may generally be of any conventional configuration, e.g. may comprise a mode locked laser. Preferably, however, the optical clock unit 14 is configured as described above with reference to FIG. 3A or 3B, namely utilizing periodic dispersive unit for producing the optimal sampling sequence as indicated above to be separated by a demultiplexer prior to detection.

The modulator 16 is a phase modulator producing a modulated optical signal $S_{mod}$ resulting from interaction between input analog signal $S_{in}$ and sampling clock signal $S_{samp}$, and the detection system utilizes interference between the modulated optical signal $S_{mod}$ and reference clock signal. To this end, sampling clock signal $S_{samp}$ passes through a beam splitting unit 19 which splits this signal into light components $L_1$ and $L_2$ where light component $L_1$ is phase modulated and the other light component $L_2$ is unmodulated presenting a reference clock signal as described above. The two branches (modulated and reference signals) interact in the detection system 18, which includes an interferometer 20, optical detector array 22, and a processor utility 24.

In the non-limiting example of FIG. 3C, the interference is a free-space interference enabling extraction of multiple interference samplings. Alternatively, interferometer 20 may utilize a waveguide-based arrangement, e.g. waveguide grating, for extracting the multiple interference samples. This is exemplified in FIG. 3D.

Figure 3D:
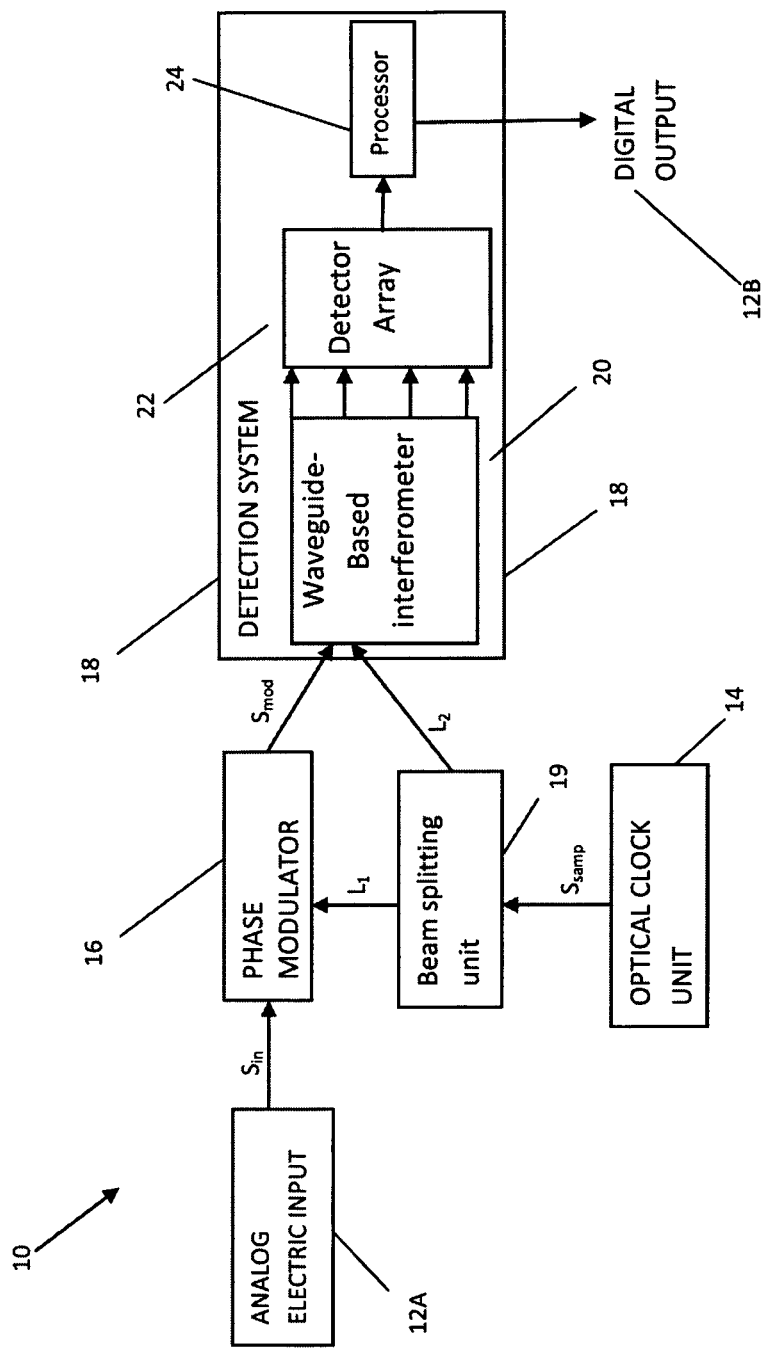

The ADC system 10 of FIG. 3D is configured generally similar to that of FIG. 3C, including electric input and output ports 12A and 12B, electro-optical modulator 16, optical clock unit 14 and detection system 18, and distinguishes from the example of FIG. 3C in that here the interferometer unit 20 is configured to implement waveguide-based interference enabling extraction of multiple interference samplings (as shown in FIG. 3D).

The optical clock unit 14 is configured to generate an optical pulse sequence, and may be of any suitable configuration, e.g. may include a mode locked laser. Preferably, the optical clock unit 14 is configured as described above with reference to FIG. 3A or 3B, namely utilizing periodic dispersive unit for producing the optimal sampling sequence as indicated above. The modulator 16 is a phase modulator producing a modulated optical signal $S_{mod}$ resulting from interaction between input analog signal $S_{in}$ and sampling clock signal $S_{samp}$, and the detection system utilizes interference between the modulated optical signal $S_{mod}$ and reference clock signal. To this end, sampling clock signal $S_{samp}$ passes through a beam splitting unit 19 which splits this signal into light components $L_1$ and $L_2$ where light component $L_1$ is phase modulated and the other light component $L_2$ is unmodulated presenting a reference clock signal as described above. The two branches (modulated and reference signals) interact in the detection system 18, which includes an interferometer 20, optical detector array 22, and a processor utility 24. The interferometer 18 is configured as waveguide-based interferemeter 20. The operational principles of an example of such interferometer in the form of waveguide grating are described below with reference to FIG. 5C.

The use of free-space interference enables spatial oversampling of interfering light components, resulting in linearly dependent information projection bases. After balanced detection and ADC quantization (noise injection), a least-squares method can be utilized to extract the phase with error reduction that scales inversely as the square root of the number of projections. The following is a more specific description of the principles using free-space interference in the ADC system, and its advantages.

In this connection, reference is made to FIG. 4A illustrating the detection technique corresponding to conventional coherent detection of a signal (Sig) with a local reference (Ref), by way of interference in a 90° optical hybrid (shown at left side), and subtraction of the photocurrents by either balanced detectors or electrical differential amplifiers. In such an arrangement, there are two inputs and four outputs. Here, a signal and a reference interfere by way of −3 dB couplers and proper phase relationships between the interconnecting optical waveguides. Each of the four outputs carries a unique interference projection, resulting in two pairs of interfering signals. By subtracting the intensity of measured photocurrents of the two pairs, the in-phase and quadrature components I and Q are obtained, which are the real and imaginary projections Re{ } and Im{ } and are independent (orthogonal) of each other. The two amplified outputs (that can be positive or negative, as opposed to the photocurrent that is always positive) measure the projection of RS* onto the real axis (termed in-phase, I, component) and the imaginary axis (termed out-of-phase or quadrature, Q, component). As the reference is known, the modulated signal can be unambiguously identified by the I and Q components, provided there were no noise sources in the system. In a high speed ADC system, quantization noise becomes the dominant factor. Moreover, the phase relationship between the interconnecting waveguides has to be maintained, which becomes difficult in a multi-wavelength and varying temperature environment.

The four outputs of the optical hybrid simply sample different interference values between the signal and the reference. Reference is made to FIGS. 4B and 4C, showing the principles of coherent detection in free space interference, where FIG. 4B shows spatial profiles of the signal and reference beams, and FIG. 4C illustrates various intensity interference patterns (in the far field) corresponding to no phase difference (curve $G_1$), t phase difference (curve $G_2$), and $\pm\pi/2$ differences (curves $G_3$ and $G_4$), and a dashed curve $G_5$ corresponding to the individual mode far-field pattern. It is shown that upon far field propagation, the intensity interference pattern between the waveguides is sensitive to the relative phase. Sampling at the indicated locations ($1^{st}$ quadrature location $P_1$, second quadrature location $P_2$, and first and second in-phase locations $P_3$ and $P_4$) allows for extracting the in phase and quadrature components. These values are to be subtracted, as in the optical hybrid case described above. The signal and reference source have an identical mode structure $\psi(x/\Delta)$, where $\psi(x)$ is the shape and $\Delta$ is the scale, and they are displaced from each other by pitch p (assuming they are centered about x=0). The far field interference field distribution is given by $$u(f_x)=\Delta\tilde{\Psi}(\Delta f_x)\{S\exp(-j2\pi f_x p/2)+R\exp(j2\pi f_x p/2)\}$$

where S and R are the signal and reference complex amplitudes, and the spatial frequency coordinate is $f_x$. Sampling the spatial intensity at four unique positions can be expressed for example as (this is not a unique set and others may be substituted, as known to those well versed in the field):

$$f_x=\{\pm 1/2p, -1/4p, 0, 1/4p\},$$

and the field at these positions corresponds to $$u=\{j(R-S), \exp(j\pi/4)(R-jS), R+S, \exp(-j\pi/4)(R+jS)\}.$$

Comparing the field distributions at these samples to those of the optical hybrid, it can be seen that both give rise to identical intensities and can be used in conjunction with balanced receivers to extract the I and Q projection components.

The use of spatial interference configuration provides for a planar lightwave circuit (PLC) implementation, which is much more robust to temperature and wavelength variations, and does not suffer the ill effects associated with waveguide crossings. This solution has been demonstrated in various PLC material systems [8-9].

Figure 5A:
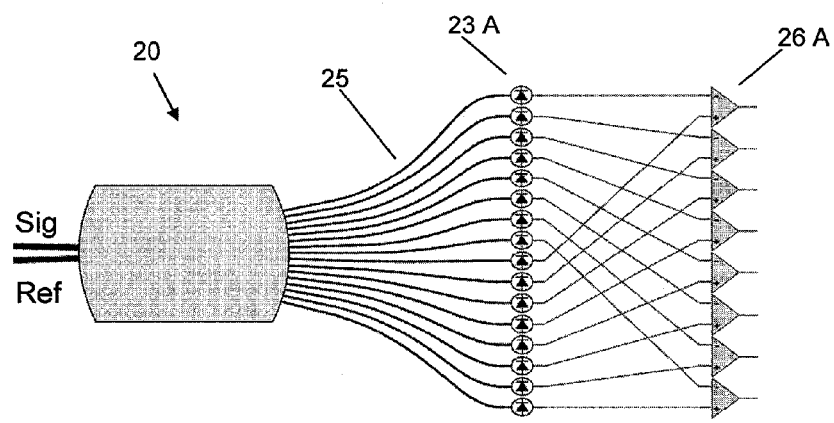
FIGS. 5A and 5B illustrates a free space interferometer suitable for implementation in planar form to be used in the ADC system of the present invention (differentiated in the electronic detection means)
Figure 5B:
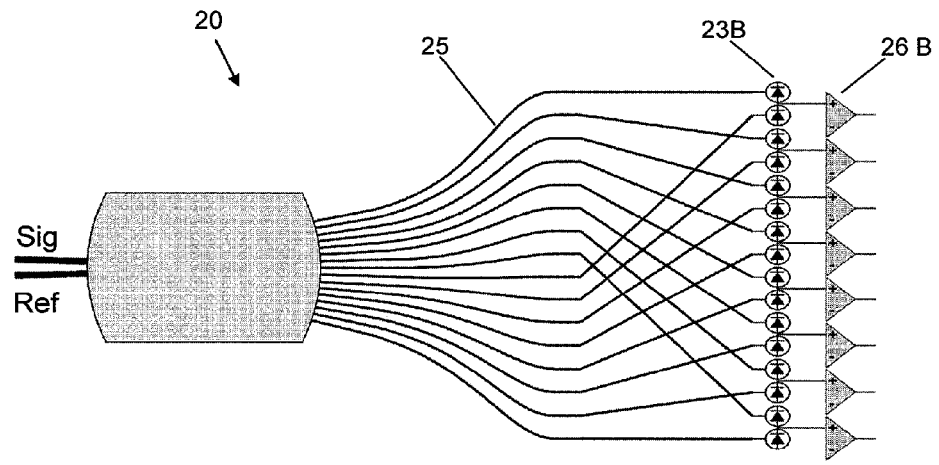

The inventor has developed a free space interferometer, shown schematically in FIGS. 5A and 5B and designated 20, having two inputs for inputting a signal (being a modulated pulse train) and a reference (clock signal) with a higher number of outputs (generally at least 6 outputs)—16 outputs, generally at 23, being shown in the present example. This configuration provides for sampling the interference signal in at least 6 positions (spatial locations). By this new information is not generated, as the full information is available in the I and Q measurements. Any other measurements are linearly dependent on them. However, if every measurement has an associated independent error term due to quantization noise in ADC, then gathering more samples and using more data about the interference advantageously provides for reducing the effect of independent noise.

As also shown in the specific but not limiting example of FIG. 5A, the outputs of the free space interferometer are coupled to the inputs of individual detectors 23A via optical fibers 25, and the detectors' outputs are connected to differential amplifiers 26A of the processor utility (24 in FIG. 3C) for subtracting and amplifying the photocurrents. The photocurrents can also be non-preferentialy amplified directly and processed without the subtraction operation, leaving a larger data processing load to the digital signal processing. In this case, each photocurrent has a large DC bias which hampers its efficient conversion to digital domain by ADC. In the example of FIG. 5B, output pairs of the free space interferometer are coupled to the inputs of balanced detectors 23B via optical fibers 25, and the balanced detectors' outputs are connected to linear amplifiers 26B of the processor utility. The interferometer 20 may utilize an optical lens or a slab lens to provide a far-field interference pattern.

Figure 5C:
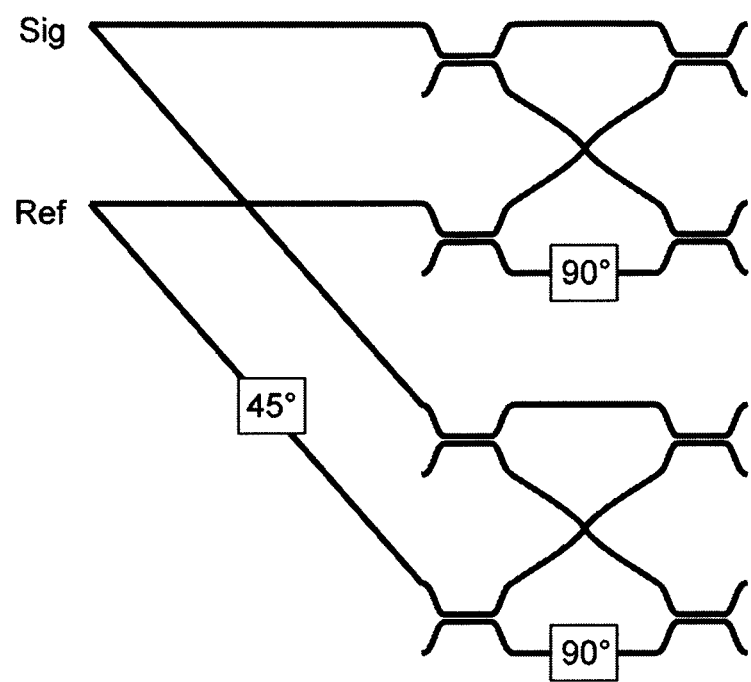
FIG. 5C is the equivalent waveguide implementation.

FIG. 5C exemplifies the operational principles of waveguide-based interference suitable to be used in the detection system of the invention to enable extraction of multiple interference samplings Here additional projection measurements are provided by utilizing two conventional 90° optical hybrids, feeding the first with the signal and reference whereas the second is fed with the reference phase shifted by 45°. This provides additional projections. The first hybrid projects onto the real (0° phasor) and imaginary (90° phasor), whereas the second optical hybrid projects onto the 45° phasor and 135° phasor.

Let us analyze the intensity (and hence photocurrent) as a function of sampling location, assuming the signal has a relative phase shift to the reference of $\phi$, and the signal and reference are displaced by distance p (pitch). When sampling at a position in spatial frequency space of $f_x=-\theta/2\pi p$, the intensity at that location is proportional to $$I=(|R|^2+|S|^2+2RS\cos(\phi-\theta))/4$$

Using additional sampling at $\theta+\pi$, and subtracting the two photocurrents, results in a signal proportional to $RS\cos(\phi-\theta)$. Hence, the difference photocurrent is a measure of the projection of the signal phasor onto the reference phasor. If $\theta=0$, the projection is onto the real axis (In-phase), and if $\theta=\pi/2$ then the projection is onto the imaginary axis (Quadrature). Now, sampling at additional spatial locations may be performed, corresponding to angles $\theta_n$, and for each angle the projection is estimated (with additive noise due primarily to ADC quantization). In other words, for an unknown phase modulation $\phi$ applied at the modulator, N noisy measurements of $\cos(\phi-\theta_n)$, where $n=1, 2, \ldots, N$ are obtained. Using an algorithm, such as one based on least squares minimization, the best estimate for the instantaneous modulation angle $\phi$ can be found.

Figures 6A, 6B:
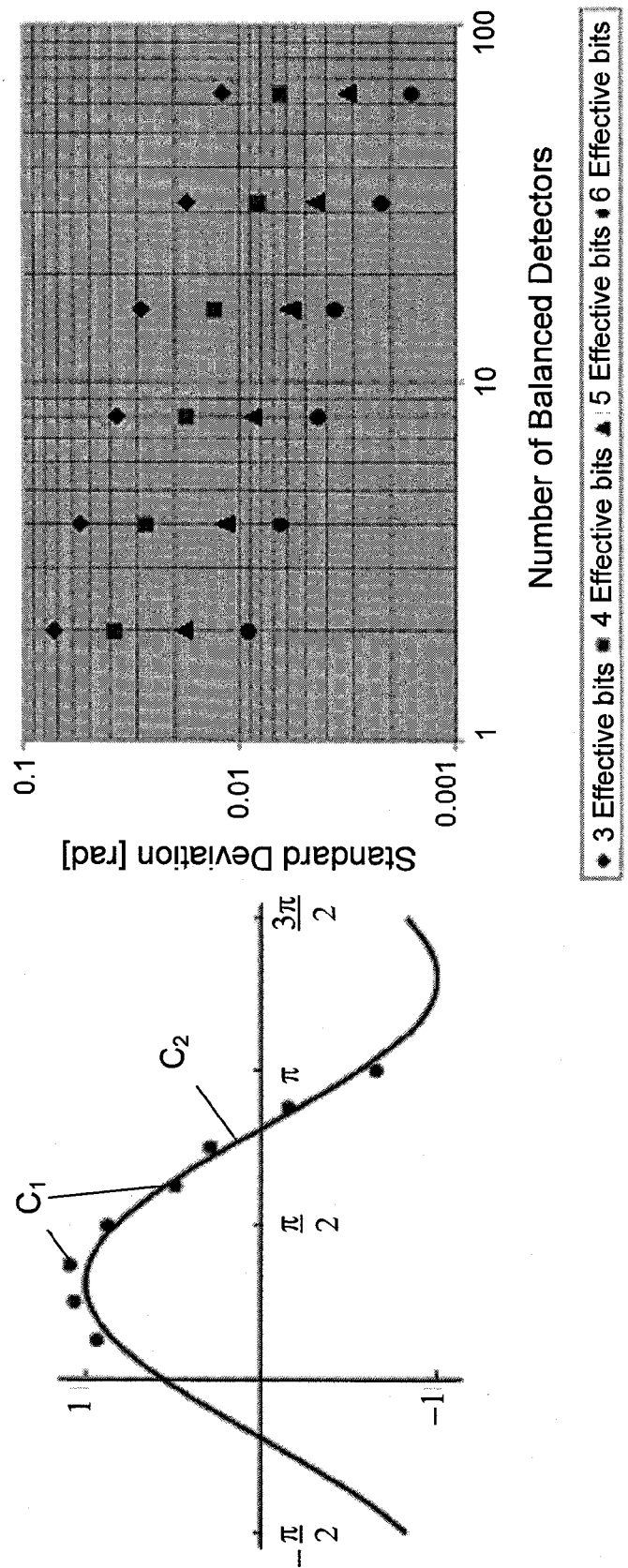
FIGS. 6A and 6B show simulation results, where

The inventor has performed simulation, consisting of 100 independent trials for extracting angle $\phi$ as a function of the number of balanced photodetectors N, and of the ENOB of each ADC. The results are shown in FIGS. 6A and 6B. FIG. 6A shows noisy measurements of the projection values, $C_1$ (noise only in y-axis, i.e. in the ADC photocurrent, while the position of sample is fixed and determined by waveguide locations in x-axis), and shows the best fit estimate for the unknown phase, resulting in the curve $C_2$. In this case, the ADC system utilizes 8 balanced detectors, 22 in FIG. 3C). FIG. 6B shows simulation results of the phase estimation error terms as a function of number of balanced photodetectors for ADCs configurations with different ENOB. As shown, the estimated error reduces with an increase in the number of measurements, and that an effective bit of resolution is gained for every quadrupling of detector counts. Hence, if the phase can be estimated from two samples (I and Q), then the error can be reduced by half (and one effective bit would be gained) with the use of 8 detectors. A second effective bit is gained by a second quadrupling (to 32). It should be noted that this is independent of the individual ENOB in the ADC system. The performance gain is obtained provided that the quantization noise is the dominant noise factor in the detection of each photocurrent.

Figure 7:
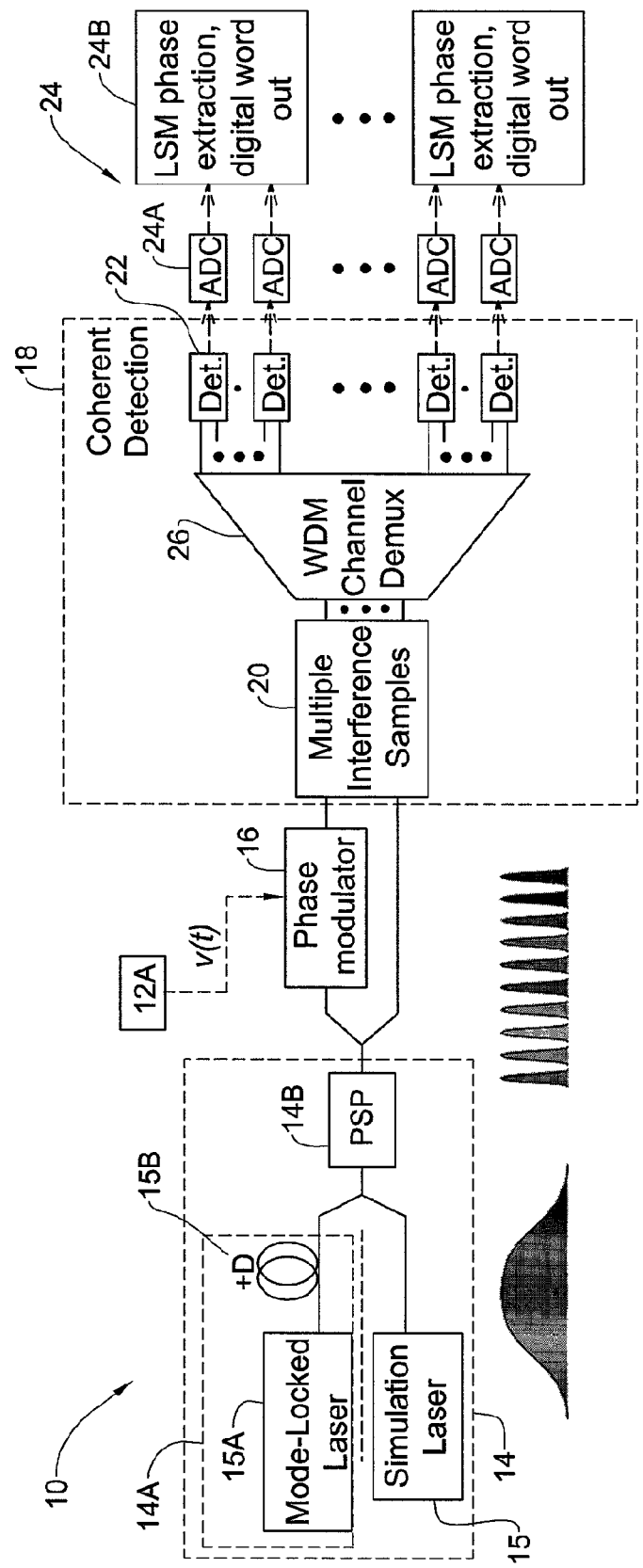
FIG. 7 exemplifies a photonically-assisted ADC system of the invention configured for both increasing the sampling rate, and improving the system resolution.

Reference is made to FIG. 7, exemplifying an ADC system 10 according to another embodiment of the invention. In this example, the ADC system is configured for both increasing the sampling rate and improving the resolution of the signal conversion. System 10 includes an input 12A for electric analog signal v(t); a clock signal generator 14; a modulator 16; and a detection system 18.

The clock signal generator 14 is configured according to the above-described examples of FIG. 3A or 3B, i.e. configured to produce a predetermined sampling pulse sequence in the form of a time separated pulse train of spectral components dispersed in a periodic fashion, where each pulse is characterized by a central wavelength different from its neighboring pulses. The clock unit 14 includes an optical pulse generator 14A configured for generating a chirped pulse signal $S_{ch}$, and a dispersive unit 14B configured for applying periodic dispersion to the chirped pulse signal $S_{ch}$, resulting in the predetermined sampling pulse sequence $S_{samp}$. As shown in the figure, optical pulse generator 14A may include either a similariton laser source 15, or a wideband pulsed laser 15A (e.g. MLL) followed by continuous dispersive unit (e.g. dispersive fiber) 15B. Thus, the clock signal generator 14 includes a combination of either similariton laser source 15 and PSP 14B, or wideband pulsed laser (e.g. MLL) 15A, continuous dispersive unit (e.g. dispersive fiber) 15B and PSP 14B.

The modulator 16 is an electro-optical phase modulator, such as for LiNbO$_3$ modulator for example. The detection system 18 includes a free space interferometer 20 coupled with an appropriate spectral splitting assembly 26 (e.g. a matching wavelength demultiplexer), a detector array 22, and a processor utility 24 including inter alia electronic ADC array 24A and digital signal processing array 24B (e.g. least squares minimization (LSM) based processors).

The clock signal generator 14 includes a chirped optical pulse generator 14A configured as described above (e.g. utilizing similariton laser, or MLL followed by a continuous dispersive unit) for generating a continuous chirped pulse, with a (nearly) linear mapping of time to wavelength. The chirped pulse enters PSP 14B which recombines the dispersed spectral components in a periodic fashion, generating the sampling pulse sequence of transform-limited (preferably equal-power) wavelength-distinguishable pulses. These pulses are split into two preferably equal-power components, one component $L_1$ being modulated in phase by modulator 16 and the other $L_2$ is used as reference. The modulated and unmodulated signals $S_{mod}$ and $L_2$ interfere in space while propagating through the interferometer 20 (e.g. slab lens), and the so-produced multiple interference samples are collected at the demultiplexer 26. The latter is configured for example as an arrayed waveguide grating for spatially separating the different wavelengths, and directing them to corresponding appropriately balanced detectors which extract the signal projections (i.e. output corresponding electrical signal). These projection values are converted to digital representation by the multiple electronic ADC of the array 24A. These digital representations (quantized projections) are processed by DSP 24B to estimate the phase applied at the modulator (e.g. by solving a least squares fit across the multiple samples).

Figure 8B:
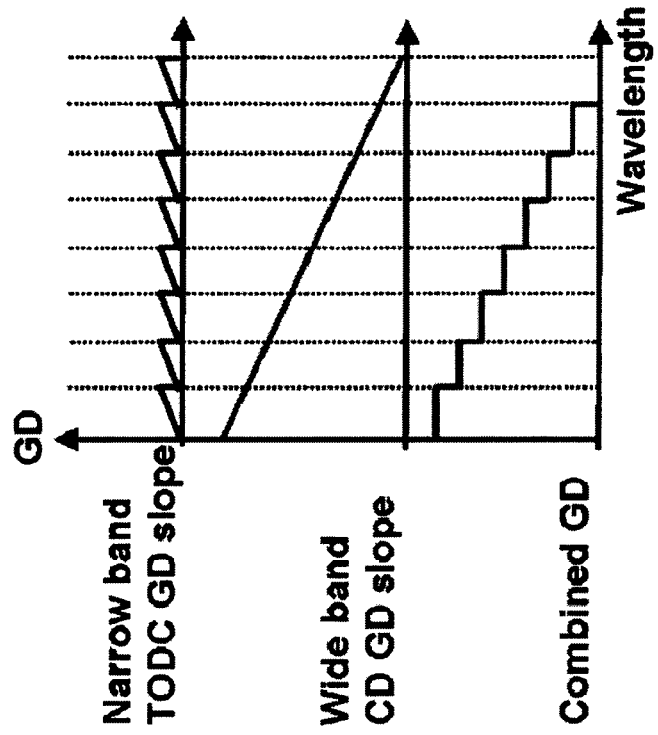
FIGS. 8A to 8C illustrate the principles of periodic dispersion applied to chirped pulses by a PSP unit of the invention.
Figure 8A:
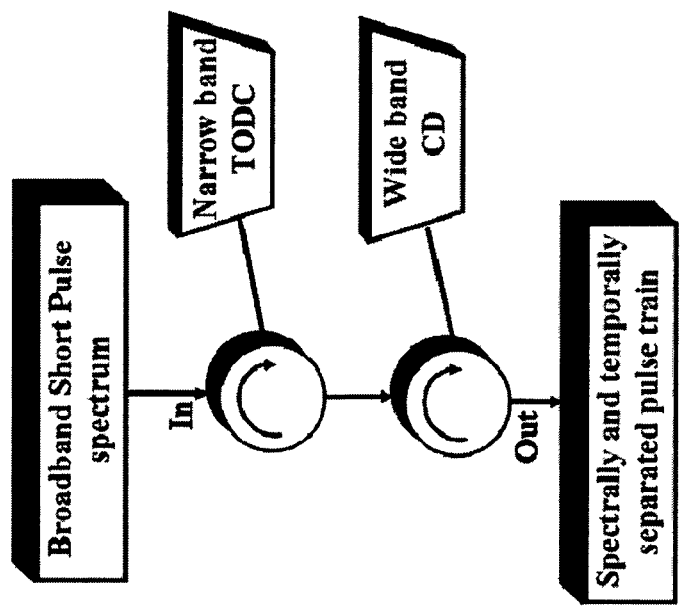
Figure 8C:
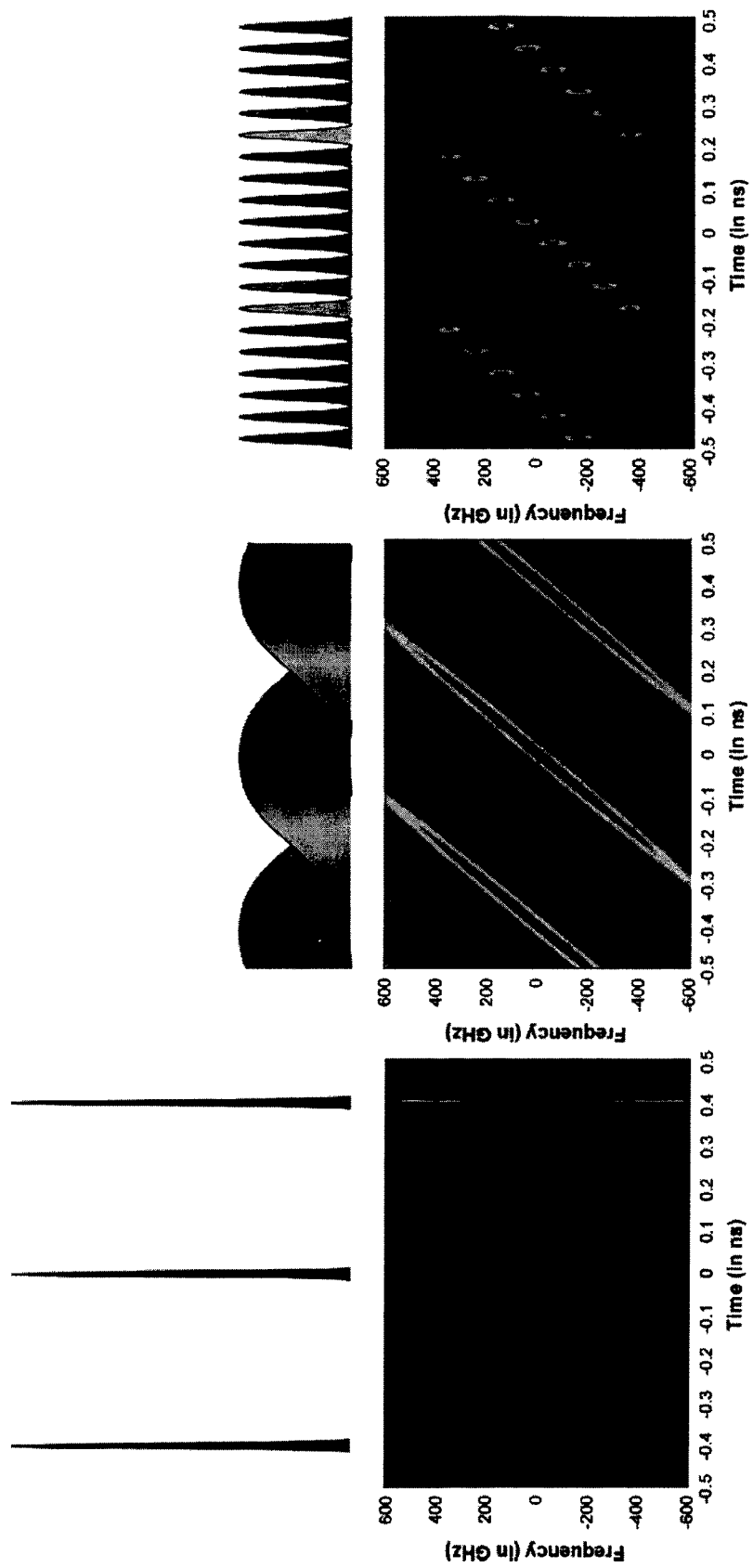

Reference is made to FIGS. 8A-8F, where FIGS. 8A-8C illustrate the principles of periodic dispersion applied to chirped pulses by the PSP unit (14B in FIGS. 3B, 3C and 7) of the invention, and FIGS. 8D to 8G show some examples of the configurations of the PSP unit.

The PSP operates to enable generation of a transfer function consisting of a tunable staircase group delay, imparting increasing time delays across contiguous spectral bandwidths. Such a staircase group delay breaks an incident ultrashort pulse into a burst of output pulses, each pulse being transform-limited by the stair bandwidth and offset from its neighbors in time by the staircase step height. The staircase group delay transfer function can be produced by cascading a continuous chromatic dispersive element with a wavelength division multiplex (WDM) dispersion compensator having a free spectral range (FSR) equal to the channel separation ("colorless"). This is shown in FIGS. 8A-8C.

FIG. 8A illustrates a combined setup: a broadband short pulse spectrum is input to a narrowband tunable optical dispersion compensator (TODC) and then to a wideband chromatic dispersive element (or in inverse order, as the case may be), to thereby provide spectrally and temporarily separate pulse train (combined staircase group delay).

FIG. 8B illustrates the group delay function of wavelength for the narrowband TODC, wideband chromatic dispersive element, and combined staircase group delay 10 operations. The TODC is preferably made appropriately tunable in step height by employing tunable chromatic dispersive elements, thus providing an ADC system with a tunable sampling frequency.

FIG. 8C illustrates the effect in time as well as in time-frequency space on the input ultrashort optical pulse used to generate the pulse sampling sequence. The optical source emits periodic short pulses being transform limited (in time-frequency space the frequencies are all appearing at the same time). After wideband dispersion is applied, the short pulses are said to be chirped, having a swept carrier frequency (in time-frequency space, the frequencies appear diagonally in time). If a similariton laser pulse is substituted for a mode locked laser, it will emit chirped pulses eliminating the need for wideband dispersion. The periodic dispersion compensation delay compresses the frequency components appearing within the FSR, creating transform limited pulses having unique center frequency. In time-frequency space, the individual pulses have their frequency components vertically aligned, but successive pulses have offset frequency components.

It should be noted that many known devices can create chromatic dispersion and colorless TODC, with optical fibers and etalons [16], respectively, being the most common. As the clock signal generator of the invention is preferably characterized by dispersion setting tunability in both the continuous dispersive unit and the parallel dispersive unit (PSP), systems based on free-space optics can be used to spatially disperse the broadband pulses with a lens and grating combination and impart quadratic phase across the spectrum [17, 18]. Instead of using a spatial light modulator for imparting different quadratic phases, the invented system may utilize Fourier optics for displacing the grating from the front focal plane [19]. This displacement results in a quadratic phase function applied across the spectrum at the lens back focal plane. Such a colorless TODC based on displacement of a waveguide grating router (WGR) has been developed, where the WGR provides the angular dispersion and the FSR matching the channel plan [D. Sinefeld, S. Ben-Ezra, C. R. Doerr, and D. M. Marom, "All-channel tunable optical dispersion compensator based on linear translation of a waveguide grating router," Opt. Lett. 36, 1410-1412 (2011), incorporated herein by reference. A similar concept can be utilized for the broadband CD generation system, using a conventional bulk diffraction grating for the WGR.

FIG. 8D exemplifies the configuration of a TODC unit 30 suitable for use in the PDP of the invention. The TODC unit 30 is based on high resolution dispersion from an arrayed waveguide grating (AWG), and has two parts displaceable one with respect to the other (by linear movement of at least one of them), which parts are configured as a planar lightwave circuit (PLC) 30A and a far-field spectral disperser 30B. The PLC 30A includes an arrayed waveguide grating 32 with, and an optional cylindrical lens 34; the far-field spectral disperser 30B includes a Fourier lens 36 and a mirror 38. The input signal is optically coupled into the first AWGs 32 and obtains an angular dispersion, and is then collected and projected by a cylindrical lens 34 while different wavelength components of the pulse accumulate different spatial frequency and the wavelength components are thus spatially separated. The Fourier lens 36 projects these different wavelength components onto a far-field plane where the mirror 38 is located and reflects them backwards into the TODC. A change in a distance $d_{N,B}$ between the PLC 30A and the Fourier lens 36 imparts a quadratic phase across the Fourier plane (shown by a dashed curve on the Fourier plane) and results in a group dispersion slope along the spectrum.

FIG. 8E exemplifies a wideband chromatic dispersion unit 40 suitable to be used as a continuous dispersive element in the clock signal generator of the invention. The wideband chromatic dispersion unit 40 is based on dispersion from a bulk diffraction grating, and includes two parts displaceable with respect to each other, one part including a collimator 42, a folding mirror 44, and a diffraction grating 46, and the other part including a Fourier lens 36 and a mirror 38. A short pulse is collected and collimated by lens 42, which directs the pulse to diffraction grating 46; the so-diffracted light is imaged by Fourier lens 36 onto the mirror 38, which reflects the light beam back to pass through lens 36 onto the diffraction grating 46 and then be reflected back by folding mirror 44. Such a folded arrangement, in which the light diffracts off the grating four times, is used to maximize the chromatic dispersion capacity and avoid spectral narrowing.

Figure 8F:
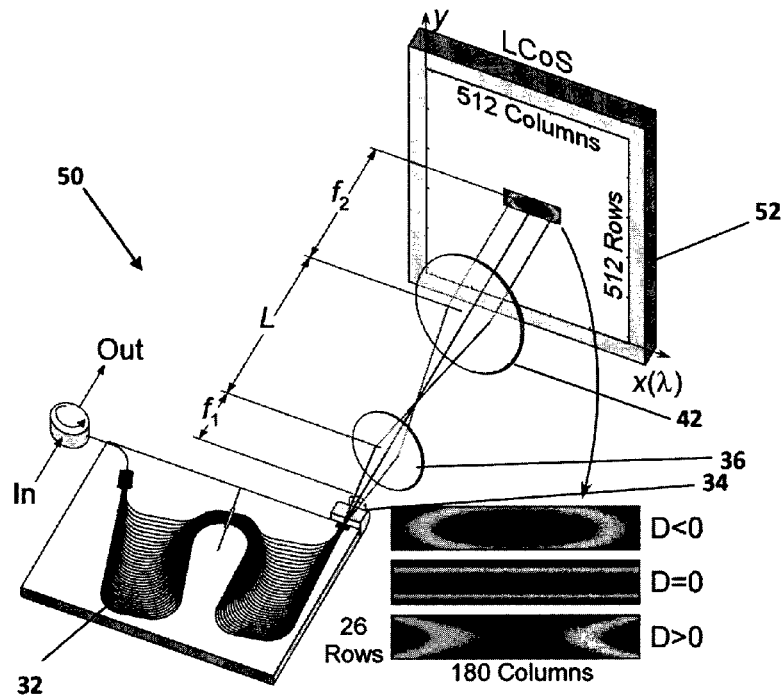

FIG. 8F shows an example of a dispersive assembly 50 which may be used in the PSP unit 14B of the invention. The dispersive assembly operates with a 100 GHz free-spectral range (FSR), and imposes the same spectral modulation for all channels on a 100 GHz [13, incorporated herein by reference]. This dispersive assembly 50 incorporates an arrayed waveguide grating in silica that terminates at the end facet and is allowed to radiate outwards, forming a phase array source. After performing a spatial Fourier transform with a lens, the spatially dispersed spectrum is obtained which is modulated in a reflection mode with a spatial light modulator (SLM) 52 such as a liquid-crystal on silicon (LCoS) SLM. The reflected and dispersed signal is recombined by back propagation through the same optical arrangement, and is separated to the output fiber via a circulator.

Figure 8G:
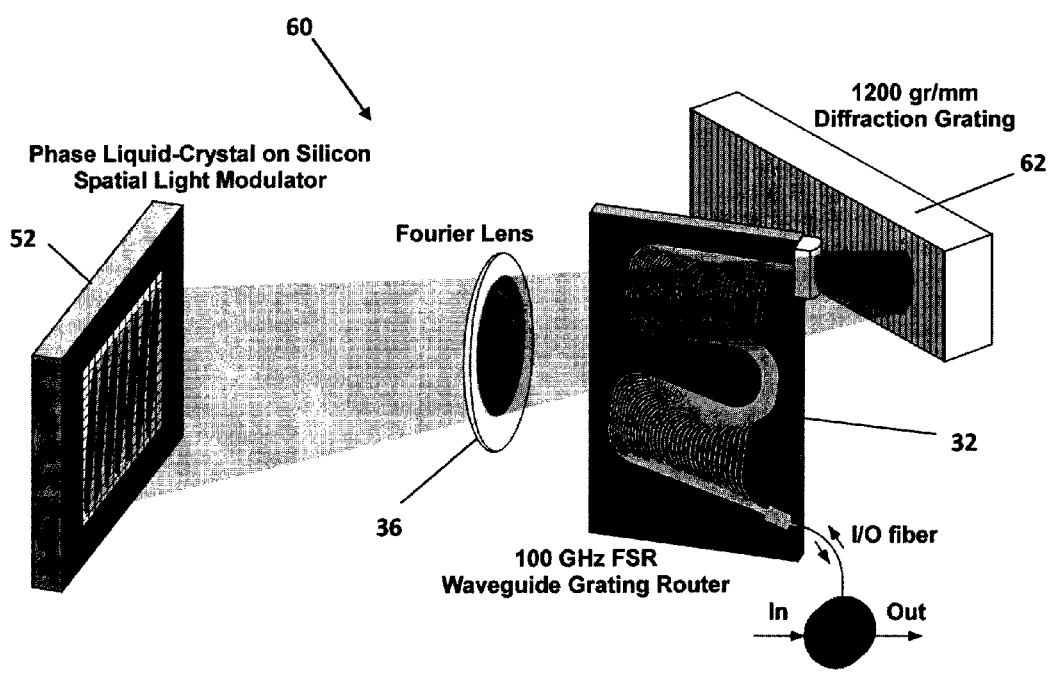

FIG. 8G shows one more example of a dispersive unit 60 suitable to be used in the PSP of the invention. The dispersive unit 60 differs from the example of FIG. 8F in that it further includes a crossed diffraction grating 62, which separates the channels on the 100 GHz FSR in the orthogonal direction [14]. The PSP configuration of this example is based on a hybrid guided wave/free-space optics arrangement, where a WGR implemented in silica waveguides disperses the light in one dimension with a 100 GHz FSR and a bulk 1200 gr/mm diffraction grating disperses the light along the second (crossed) dimension and separates the diffraction orders of the WGR grating. The diffracted light is then focused by a Fourier lens onto an LCoS, two-dimensional phase SLM. With the LCoS SLM, one can prescribe phase and amplitude to the signal's spectral components. As shown in the figure, light enters a planar lightwave circuit (PLC) containing an extremely high resolution WGR through the input/output (I/O) waveguide. The WGR may be fabricated in silica-on-silicon technology with 0.8% index contrast waveguides and may include 34 grating arms that are "pinched" in the middle for conserving wafer area, reducing the grating sensitivity to wafer refractive index gradients (enabling the insertion of a half-wave plate to make the WGR polarization-independent). Here, the grating arms terminate at the PLC edge and the light radiates to free-space (instead of employing a second slab-lens region that demultiplexes to output waveguides). A cylindrical lens (with the focal length of 3 mm) is affixed at the PLC edge and collimates the light in the guided direction. This results in a two-dimensional dispersion enabling independent modulation of all spectral components. The advantage of using the dispersive system of FIG. 8G is that the dispersion compensation applied to each frequency band can now be optimized and used to correct deviations from linear dispersion of the chirped pulse.

Either one of the above configurations of the dispersive units, as well as any other suitable configuration, can be used in the PSP of the present invention to perform the sampling pulse generation, as the required functionality is wavelength periodic. Turning back to FIG. 8B, it should be understood that the dispersive fiber that can be used to chirp the signal has a nearly linear group delay variation to wavelength (ignoring dispersion slope effects), and accordingly a linear sweep of carrier frequency as a function of time is obtained. The PSP can impose any spectral transfer function. For the purposes of the invention, an inverse slope linear group delay variation to wavelength is utilized, albeit on a periodic function. The group delay does not accumulate from channel to channel. The resultant (cascaded) transfer function thus appears as a staircase variation of group delay to wavelength. A short transform limited pulse entering this arrangement would be broken up to a sequence of pulses, separated in time by the group delay jump and of duration inversely proportional to the width of the stairs. This constitutes the formation of the sampling pulses. Since the amplitude response can be carved, the transitions can be smoothed such that the pulse in time is well-behaved (will appear Gaussian-like and not sinc-like). The added ability to access each channel in such a 2D PSP can be further used to compensate for the effects of dispersion slope, so that the sampling times are perfectly distributed in time with no jitter.

The invention claimed is:

1. A photonically assisted analog to digital conversion (ADC) system comprising:
    an optical sampling signal generator configured and operable for generating an optical sampling signal comprising a predetermined sampling pulse sequence in the form of a time separated pulse train of spectral components, where each pulse is distinguishable by a central wavelength thereof different from its neighboring pulses;
    an electro-optical modulator for interacting an input electric analog signal and the optical sampling signal and generating a modulated optical signal indicative of said input signal; and
    a detection system configured and operable for receiving said modulated optical signal and generating an output digital signal corresponding to said input electric analog signal;
    the ADC system being configured and operable for carrying out at least one of the following:
    (a) interfering said modulated optical signal with a reference signal corresponding to the optical sampling signal so as to provide oversampling of interference terms of the signals, thereby improving phase estimation corresponding to the input electric analog signal; and
    (b) providing said predetermined sampling pulse sequence in the form of the time separated pulse train of spectral components dispersed in a periodic fashion, the optical sampling signal generator having one of the following configurations: (i) comprises a cascade arrangement of a continuous chromatic dispersive element and a wavelength division multiplex (WDM) dispersion compensator having a free spectral range (FSR) equal to a channel separation, thereby producing a staircase group delay transfer function, which separates an incident transform-limited ultrashort pulse into a burst of output pulses, each being transform-limited by a stair bandwidth and offset from its neighboring pulses in time by a staircase step height; (ii) comprises an optical dispersion compensator, and a wideband chromatic dispersive unit, to thereby provide spectrally and temporally separate pulse train presenting a combined staircase group delay.

2. The ADC system of claim 1, wherein the optical sampling signal generator comprises a chirped pulse generator; and a periodic dispersion unit in an optical path of a chirped pulse, said time separated pulse train of spectral components being therefore dispersed in the periodic fashion.

3. The ADC system of claim 2, wherein the chirped pulse generator comprises one of the following: (i) a similariton pulse amplifier or a similariton laser; and (ii) a wideband pulsed laser, and a continuous dispersive media for passing a wideband pulse therethrough.

4. The ADC system of claim 2, wherein the chirped pulse generator comprises a continuous dispersive media comprising a dispersive optical fiber for passing a wideband pulse therethrough.

5. The ADC system of claim 2, wherein the chirped pulse generator comprises wideband pulsed laser comprising a mode locked laser.

6. The ADC system of claim 1, wherein the optical dispersion compensator comprises one or more tunable chromatic dispersive elements configured to generate group delay staircase transfer function, thereby being tunable in group delay step height, the optical sampling signal generator thereby providing a tunable sampling frequency.

7. The ADC system of claim 1, wherein the optical dispersion compensator comprises two parts displaceable one with respect to the other, which comprise, respectively, a planar lightwave circuit (PLC), and a far-field spectral disperser, a tunable optical dispersion compensator being thereby configured and operable for performing high resolution dispersion from an arrayed waveguide grating.

8. The ADC system of claim 7, wherein the PLC includes an arrayed waveguide grating, and the far-field spectral disperser includes a Fourier lens and a mirror, a change in a distance between the PLC and the Fourier lens imparting a quadratic phase across a Fourier plane resulting in a group dispersion slope along a spectrum.

9. The ADC system of claim 1, wherein the electro-optical modulator is configured and operable as a phase modulator, providing said phase modulated optical signal; and the detection system comprises an interferometer unit for interfering the modulated signal with the reference signal corresponding to the optical sampling signal so as to provide said oversampling of interference terms of the signals.

10. The ADC system of claim 9, wherein the interferometer unit has one of the following configurations: (i) comprises a waveguide device configured and operable to provide waveguide-based interference; (ii) is configured for free space interference.

11. The ADC system of claim 10, wherein the interferometer unit comprises two inputs for respectively inputting the modulated signal and the reference signal, and at least 6 outputs corresponding to 6 samples of the modulated signal.

12. The ADC system of claim 1, comprising a wavelength demultiplexer for spatially separating wavelength components in an interference pattern resulting from the interference between the modulated and reference signals.

13. A photonically assisted analog to digital conversion (ADC) system
    comprising:
    an optical sampling signal generator configured and operable for generating an optical sampling signal comprising a predetermined sampling pulse sequence in the form of a time separated pulse train of spectral components, where each pulse is distinguishable by a central wavelength thereof different from its neighboring pulses;
    an electro-optical modulator for interacting an input electric analog signal and the optical sampling signal and generating a modulated optical signal indicative of said input signal; and
    a detection system configured and operable for receiving said modulated optical signal and generating an output digital signal corresponding to said input electric analog signal;
    the ADC system being configured and operable for carrying out at least one of the following:

(a) interfering a phase modulated optical signal with a reference signal corresponding to the optical sampling signal so as to provide oversampling of interference terms of the signals, thereby improving phase estimation corresponding to the input electric analog signal; and (b) providing said predetermined sampling pulse sequence in the form of the time separated pulse train of spectral components dispersed in a periodic fashion, the optical sampling signal generator comprising a chirped pulse generator; and a periodic dispersion unit in an optical path of a chirped pulse, wherein the periodic dispersion unit comprises a Photonic Spectral Processor (PSP) configured and operable for applying a periodically reversed dispersion relative to the chirped pulse of the chirped pulse generator, thereby grouping frequency components of the chirped pulse by applying dispersion compensation to each group to reverse the chirp profile within each group, and producing a sequence of sub-pulses, each characterized by its central wavelength and a temporal delay according to that of the respective group.

14. The ADC system of claim 13, wherein the electro-optical modulator is configured and operable as a phase modulator, providing said phase modulated optical signal; and the detection system comprises an interferometer unit for interfering the modulated signal with the reference signal corresponding to the optical sampling signal so as to provide said oversampling of interference terms of the signals.

15. The ADC system of claim 14, wherein the interferometer unit has one of the following configurations: (i) comprises a waveguide device configured and operable to provide waveguide-based interference; (ii) is configured for free space interference.

16. The ADC system of claim 15, wherein the interferometer unit comprises two inputs for respectively inputting the modulated signal and the reference signal, and at least 6 outputs corresponding to 6 samples of the interference terms between the modulated signal and the reference signal.

17. The ADC system of claim 13, comprising a wavelength demultiplexer for spatially separating wavelength components of the oversampled signals in the interference pattern resulting from the interference between the modulated and reference signals.

18. A photonically assisted analog to digital conversion (ADC) system comprising:
an optical sampling signal generator configured and operable for generating an optical sampling signal comprising a predetermined sampling pulse sequence in the form of a time separated pulse train of spectral components, where each pulse is distinguishable by a central wavelength thereof different from its neighboring pulses;
an electro-optical modulator for interacting an input electric analog signal and the optical sampling signal and generating a modulated optical signal indicative of said input signal; and
a detection system configured and operable for receiving said modulated optical signal and generating an output digital signal corresponding to said input electric analog signal;
the ADC system being configured and operable for carrying out at least one of the following:
(a) interfering a phase modulated optical signal with a reference signal corresponding to the optical sampling signal so as to provide oversampling of interference terms of the signals, thereby improving phase estimation corresponding to the input electric analog signal; and
(b) providing said predetermined sampling pulse sequence in the form of the time separated pulse train of spectral components dispersed in a periodic fashion, the optical sampling signal generator comprising a chirped pulse generator; and a periodic dispersion unit in an optical path of a chirped pulse,
wherein the periodic dispersion unit is configured and operable for generating a transfer function comprising a tunable staircase group delay, and increasing time delays across contiguous spectral bandwidths, the staircase group delay breaking an incident ultrashort pulse into a burst of output pulses, each pulse being transform-limited by a stair bandwidth and offset from its neighboring pulses in time by a staircase step height.

19. The ADC system of claim 18, wherein the electro-optical modulator is configured and operable as a phase modulator, providing said phase modulated optical signal; and the detection system comprises an interferometer unit for interfering the modulated signal with the reference signal corresponding to the optical sampling signal so as to provide said oversampling of interference terms of the signals.

20. The ADC system of claim 19, wherein the interferometer unit has one of the following configurations: (i) comprises a waveguide device configured and operable to provide waveguide-based interference; (ii) is configured for free space interference.

21. The ADC system of claim 20, wherein the interferometer unit comprises two inputs for respectively inputting the modulated signal and the reference signal, and at least 6 outputs corresponding to 6 samples of the interference signal resulting from interference between the modulated and reference signals.

22. The ADC system of claim 18, comprising a wavelength demultiplexer for spatially separating wavelength components of the oversampled signals in the interference pattern resulting from the interference between the modulated and reference signals.

23. A photonically assisted analog to digital conversion (ADC) system comprising:
an optical sampling signal generator configured and operable for generating an optical sampling signal comprising a predetermined sampling pulse sequence in the form of a time separated pulse train of spectral components, where each pulse is distinguishable by a central wavelength thereof different from its neighboring pulses;
an electro-optical modulator for interacting an input electric analog signal and the optical sampling signal and generating a modulated optical signal indicative of said input signal; and
a detection system configured and operable for receiving said modulated optical signal and generating an output digital signal corresponding to said input electric analog signal;
the ADC system being configured and operable for carrying out at least one of the following:
(a) interfering a phase modulated optical signal with a reference signal corresponding to the optical sampling signal so as to provide oversampling of interference terms of the signals, thereby improving phase estimation corresponding to the input electric analog signal; and
(b) providing said predetermined sampling pulse sequence in the form of the time separated pulse train of spectral components dispersed in a periodic fashion, the optical sampling signal generator comprising a chirped pulse generator; and a periodic dispersion unit in an optical path of a chirped pulse, wherein the chirped pulse generator comprises a wideband chromatic dispersive unit comprises two parts displaceable with respect to each other, one part including a collimator, a folding mirror, and a diffraction grating, and the other part including a Fourier lens and a mirror.

24. The ADC system of claim 23, wherein the electro-optical modulator is configured and operable as a phase modulator, providing said phase modulated optical signal; and the detection system comprises an interferometer unit for interfering the modulated signal with the reference signal corresponding to the optical sampling signal so as to provide said oversampling of interference terms of the signals.

25. The ADC system of claim 24, wherein the interferometer unit has one of the following configurations: (i) comprises a waveguide device configured and operable to provide waveguide-based interference; (ii) is configured for free space interference.

26. The ADC system of claim 25, wherein the interferometer unit comprises two inputs for respectively inputting the modulated signal and the reference signal, and at least 6 outputs corresponding to 6 samples of the interference signal resulting from interference between the modulated and reference signals.

27. The ADC system of claim 23, comprising a wavelength demultiplexer for spatially separating wavelength components of the oversampled signals in the interference pattern resulting from the interference between the modulated and reference signals.

28. A photonically assisted analog to digital conversion (ADC) system comprising:
   an optical sampling signal generator configured and operable for generating an optical sampling signal comprising a predetermined sampling pulse sequence in the form of a time separated pulse train of spectral components, where each pulse is distinguishable by a central wavelength thereof different from its neighboring pulses;
   an electro-optical modulator for interacting an input electric analog signal and the optical sampling signal and generating a modulated optical signal indicative of said input signal; and
   a detection system configured and operable for receiving said modulated optical signal and generating an output digital signal corresponding to said input electric analog signal;
   the ADC system being configured and operable for carrying out at least one of the following:
   (a) interfering a phase modulated optical signal with a reference signal corresponding to the optical sampling signal so as to provide oversampling of interference terms of the signals, thereby improving phase estimation corresponding to the input electric analog signal; and
   (b) providing said predetermined sampling pulse sequence in the form of the time separated pulse train of spectral components dispersed in a periodic fashion, the optical sampling signal generator comprising a chirped pulse generator; and a periodic dispersion unit in an optical path of a chirped pulse,
   wherein the periodic dispersion unit has one of the following configuration: (1) comprises a dispersive assembly comprising an arrayed waveguide grating configured to form a phase array source, a spatial Fourier transformer, and a reflection-mode spatial light modulator, thereby enabling recombining of reflected and dispersed signals by back propagation through the same dispersive assembly, and being separated to an output fiber via a circulator; and (2) comprises a crossed diffraction grating dispersing light in a direction substantially perpendicular to a dispersion direction of the arrayed waveguide grating.

29. The ADC system of claim 28, wherein the electro-optical modulator is configured and operable as a phase modulator, providing said phase modulated optical signal; and the detection system comprises an interferometer unit for interfering the modulated signal with the reference signal corresponding to the optical sampling signal so as to provide said oversampling of interference terms of the signals.

30. The ADC system of claim 29, wherein the interferometer unit has one of the following configurations: (i) comprises a waveguide device configured and operable to provide waveguide-based interference; (ii) is configured for free space interference.

31. The ADC system of claim 30, wherein the interferometer unit comprises two inputs for respectively inputting the modulated signal and the reference signal, and at least 6 outputs corresponding to 6 samples of the interference terms between the modulated signal and the reference signal.

32. The ADC system of claim 28, comprising a wavelength demultiplexer for spatially separating wavelength components of the oversampled signals in the interference pattern resulting from the interference between the modulated and reference signals.

33. A system comprising: an optical sampling signal generator for generating an optical sampling signal; an electro-optical modulator configured and operable as a phase modulator for interacting an input signal and an optical sampling signal and generating a phase-modulated optical signal indicative of said input signal; and a detection system configured and operable for receiving said modulated optical signal and generating an output signal corresponding to said input signal, wherein the detection system comprises an interferometer unit for interfering the modulated signal with a reference signal corresponding to the optical sampling signal, the interferometer unit being configured and operable for oversampling of interference terms of the phase modulated signal and the reference signal, thereby improving phase estimation corresponding to the input signal.

34. An optical sampling signal generator for use in an analog to digital conversion (ADC) system, the optical sampling signal generator comprising a chirped pulse generator, and a periodic dispersion unit in an optical path of a chirped pulse, and being configured and operable for generating an optical sampling signal comprising a predetermined sampling pulse sequence in the form of a time separated pulse train of spectral components dispersed in a periodic fashion, where each pulse is characterized by a central wavelength different from its neighboring pulses, wherein the periodic dispersion unit has one of the following configurations:
   (1) the periodic dispersion unit is configured and operable for applying to the chirped pulse a periodically reversed dispersion relative to a wavelength profile of the chirped pulse, thereby grouping frequency components of the chirped pulse and applying dispersion compensation to each group separately to reverse the wavelength profile of each group, and producing a sequence of sub-pulses, each characterized by its central wavelength and a temporal delay according to that of the respective group;
   (2) the periodic dispersion unit is configured and operable for generating a transfer function comprising a tunable staircase group delay, and increasing time delays across contiguous spectral bandwidths, the staircase group delay dividing an incident ultrashort pulse into a burst of output pulses, each pulse being transform-limited by a stair bandwidth and offset from its neighboring pulses in time by a staircase step height.

35. The optical sampling signal generator of claim 34, wherein the chirped pulse generator comprises one of the following: a similariton pulse amplifier; a similariton laser; and a wideband pulsed laser and a continuous dispersive media for passing a wideband pulse therethrough.

36. A method for use in photonically assisted analog to digital conversion (ADC), the method comprising:
  generating an optical sampling signal comprising a predetermined sampling pulse sequence in the form of a time separated pulse train of spectral components dispersed in a periodic fashion, where each pulse is distinguishable by a central wavelength thereof different from its neighboring pulses;
  interacting an input electric analog signal and the optical sampling signal and generating a phase modulated optical signal indicative of said input signal;
  receiving said modulated optical signal and interfering it with a reference signal corresponding to the optical sampling signal, said interfer the reference signal, thereby improving phase estimation corresponding to the i ing comprising oversampling interference terms of the phase modulated signal and nput electric analog signal and generating an output digital signal corresponding to said input electric analog signal.

* * * * *